US008653176B2

(12) United States Patent
Nakamichi et al.

(10) Patent No.: US 8,653,176 B2
(45) Date of Patent: Feb. 18, 2014

(54) THERMALLY CONDUCTIVE MATERIAL AND THERMALLY CONDUCTIVE SHEET MOLDED FROM THE THERMALLY CONDUCTIVE MATERIAL

(75) Inventors: Motonori Nakamichi, Tokyo (JP); Yasuaki Konomi, Tokyo (JP); Takeshi Yasui, Tokyo (JP); Katsumi Suzuki, Tokyo (JP)

(73) Assignee: Asahi Kasei E-Materials Corporation, Tokyo (JP)

( * ) Notice: Subject to any disclaimer, the term of this patent is extended or adjusted under 35 U.S.C. 154(b) by 533 days.

(21) Appl. No.: 12/520,000

(22) PCT Filed: Dec. 26, 2006

(86) PCT No.: PCT/JP2006/325846
§ 371 (c)(1),
(2), (4) Date: Jun. 18, 2009

(87) PCT Pub. No.: WO2008/084512
PCT Pub. Date: Jul. 17, 2008

(65) Prior Publication Data
US 2010/0012884 A1 Jan. 21, 2010

(51) Int. Cl.
*C08K 3/22* (2006.01)
(52) U.S. Cl.
USPC .......... 524/432; 524/571; 524/575; 524/577; 524/578; 524/579
(58) Field of Classification Search
USPC .................. 524/432, 571, 575, 577, 578, 579
See application file for complete search history.

(56) References Cited

U.S. PATENT DOCUMENTS

| | | | |
|---|---|---|---|
| 4,501,857 A | 2/1985 | Kishimoto et al. | |
| 4,673,714 A | 6/1987 | Kishimoto et al. | |
| 5,115,035 A | 5/1992 | Shiraki et al. | |
| 5,527,753 A | 6/1996 | Engel et al. | |
| 5,708,092 A | 1/1998 | Schwindeman et al. | |
| 6,294,257 B1 * | 9/2001 | Tsukakoshi et al. | 428/400 |
| 7,807,241 B2 * | 10/2010 | Sasagawa et al. | 428/35.4 |
| 2008/0118750 A1 * | 5/2008 | Sasagawa et al. | 428/343 |

FOREIGN PATENT DOCUMENTS

| | | |
|---|---|---|
| EP | 1 104 766 B1 | 5/2004 |
| GB | 2 241 239 A | 8/1991 |
| JP | 42-8704 A | 4/1942 |
| JP | 43-6636 B | 3/1943 |
| JP | 62-131033 A | 6/1987 |
| JP | 63-4841 B2 | 2/1988 |
| JP | 1-37970 B2 | 8/1989 |
| JP | 1-217072 A | 8/1989 |
| JP | 1-225663 A | 9/1989 |
| JP | 1-53851 B2 | 11/1989 |
| JP | 2-9041 B2 | 2/1990 |
| JP | 4-39495 B2 | 6/1992 |
| JP | 5-12361 B2 | 2/1993 |
| JP | 5-78516 A | 3/1993 |
| JP | 05078516 A * | 3/1993 |
| JP | 7-51646 B2 | 6/1995 |
| JP | 8-109219 A | 4/1996 |
| JP | 2000-56551 A | 9/2000 |
| JP | 2001-247870 A | 9/2001 |
| JP | 2002-194197 A | 7/2002 |
| JP | 2002-206030 A | 7/2002 |
| JP | 2003-49046 A | 2/2003 |
| JP | 2003-82245 A | 3/2003 |
| JP | 2003-113272 A | 4/2003 |
| JP | 2003-113318 A | 4/2003 |
| JP | 2003-277560 A | 10/2003 |
| JP | 2003277560 A * | 10/2003 |
| JP | 2004-59741 A | 2/2004 |
| JP | 2006-57064 A | 3/2006 |
| WO | WO-00/09518 A1 | 2/2000 |
| WO | WO 2004101269 A1 * | 11/2004 |

OTHER PUBLICATIONS

Machine translation of JP 2003277560 A.*
Machine translation of JP 05078516 A.*
Kolthoff, I. M., et al. "Determination of Polystyrene in GR-S Rubber", Journal of Polymer Science, vol. 1, No. 5 (Jun. 5, 1946), pp. 429-433.
Tanaka, Y. et al., "Determination of Sequence in Styrene-Butadiene Copolymer I. H-NMR Study of Styrene Oligomers", Rubber Chemistry and Technology, vol. 54, No. 4, 1981, pp. 685-691.
J. E. Mark, et al. "Polyphosphazenes", Inorganic Polymers, Chapter 3, Prestice-Hall International, Inc. 1992, pp. 61-140.

* cited by examiner

*Primary Examiner* — Ling Choi
*Assistant Examiner* — Wenwen Cai
(74) *Attorney, Agent, or Firm* — Birch, Stewart, Kolasch & Birch, LLP

(57) ABSTRACT

Disclosed is a thermally conductive material having excellent heat conductivity and insulating properties and having flame retardancy while retaining flexibility and toughness. More specifically, there is provided a thermally conductive material comprising: a hydrogenated copolymer (1) and/or a modified hydrogenated copolymer (2) in which each has a specific structure and is contained in a specific amount; and zinc oxide (3) comprising a core part and acicular crystal parts extending from the core part in four axial directions. The thermally conductive material optionally further comprises a paraffin oil (4), a flame retardant (5), or a filler (6) having a thermal conductivity of 10 to 400 W/m·K (the zinc oxide (3) is excluded).

10 Claims, No Drawings

THERMALLY CONDUCTIVE MATERIAL AND THERMALLY CONDUCTIVE SHEET MOLDED FROM THE THERMALLY CONDUCTIVE MATERIAL

TECHNICAL FIELD

The present invention relates to a thermally conductive material and a thermally conductive sheet molded from the thermally conductive material which are used in applications where the thermally conductive material and sheet are allowed to adhere closely to semiconductor elements such as ICs, CPUs, LEDs, or LSIs on electronic substrates in electric and electronic devices to dissipate heat from the semiconductor elements.

BACKGROUND ART

As digital household appliances have become common, there is an increasing need for higher-speed and higher-performance electric and electronic devices. In electric and electronic devices, semiconductor elements for electronic control such as LSIs and CPUs consume more power and thus produce more heat because of higher integration and higher-speed operations in computers. Heat needs to be dissipated from such semiconductor elements to prevent problems such as the occurrence of failures in the semiconductor elements. A method of dissipating heat for general electric and electronic devices is to install a cooling part such as a heatsink in the devices and forcibly cool the heatsink by using a cooling fan or the like. In compact electric devices such as laptop computers and densely-packed electronic devices, heat is dissipated by means of application of silicone grease because of limitations such as the small space available for the installation of a cooling fan or the like. However, silicone grease have problems such as low work efficiency, part contamination due to the squeezing-out of the grease after application, and limited use under high load due to poor cushioning.

Thermally conductive sheets are used to meet the requirements for higher-performance electric and electronic devices. A thermally conductive sheet is a flexible sheet which is effective in placing it between a rigid cooling part such as a heatsink and a flexible heating element and improving the proximity of both parts. If both parts are brought closer to each other, heat can be conducted to the cooling part more efficiently.

The most commonly used thermally conductive sheet is a thermally conductive sheet produced by mixing a filler having a relatively high thermal conductivity into a silicone rubber. This silicone rubber-based thermally conductive sheet is easy to handle. However, the silicone rubber-based thermally conductive sheet has problems such as expensive silicone resin itself as a raw material and an increased number of steps due to a required curing step. In addition, a silicone resin contains low molecular weight siloxane in it, so when this thermally conductive sheet is placed on a heating element for use, low molecular weight siloxane gas is generated. The gas may adhere to an electrode contact or the like to generate silicon dioxide, leading to contact failure.

In addition, a thermally conductive sheet is also required to meet various physical characteristics other than thermal conductivity.

For example, a thermally conductive sheet is required to be electrically insulating to prevent failure due to the passage of current through an electronic substrate. This is because the sheet is often placed on the electronic substrate with the sheet in contact with the electronic substrate.

In addition, if there is a gap between a heating element such as a CPU and a cooling part such as a heatsink, sometimes a thermally conductive sheet having a thickness of greater than 1 mm and 3 cm or less is used. In this case, the thermally conductive sheet is required to be flexible and tough. This requirement is intended to prevent material breaking when the sheet is fixed with the thermally conductive sheet under pressure between the heating element and the cooling part.

In addition, when a thermally conductive sheet having a thickness of 1 mm or less is placed on, for example, a CPU on an electronic substrate, sometimes sheet positioning fails on the first try and is separated to place it again. In this case, if the sheet has poor toughness, the sheet itself is torn off, resulting in poor yield.

In addition, thermally conductive sheets are used not only in electric and electronic devices but also for house floor heating. This latter use is intended to conduct heat from hot water flowing through circulation pipes to the floor. A thin aluminum film is used as a thermally conductive sheet at present. However, the aluminum film lacks cushioning, so it provides poor proximity of the pipes and the floor and cannot heat the whole floor efficiently and uniformly.

Furthermore, if a thermally conductive sheet is used for internal parts of low power electric and electronic devices, the sheet is required to be flame-retardant in view of safety.

Patent Documents 1 and 2 proposes that a zinc oxide whisker is added to a resin. This addition is intended to make the resin composition electrically conductive or make the resin mechanically stronger.

Patent Document 3 proposes that a filler is added to a styrene-based hydrogenated copolymer produced by hydrogenating a copolymer comprising a conjugated diene and a vinyl aromatic. This addition is intended to make the resin composition more resistant to wear and abrasion and mechanically stronger. Although this patent document describes a spherical zinc oxide as a filler, the use of the spherical zinc oxide does not allow excellent thermal conductivity to develop. In addition, the patent document has no description of flame retardancy.

Patent Document 4 proposes a resin composition produced by mixing a paraffin oil, a thermally conductive filler, and a flame retardant into a mixture of a styrene-based thermoplastic elastomer and a propylene-based polymer. The resin composition uses the propylene-based polymer for higher processability and heat resistance and the paraffin oil for use of a large amount of the filler and flexibility. The styrene-based thermoplastic elastomer and the propylene-based polymer are incompatible with each other regardless of whether or not the paraffin oil is added. For this reason, disadvantages of the resin composition are poor toughness as a material and brittleness occurring when it is processed into a sheet or a molded body. In addition, the amount of the paraffin oil is very large because it is 3.5 times or more the total amount of styrene-based thermoplastic elastomer and propylene-based polymer, so the paraffin oil easily bleed out of the interface between both phases of the incompatible styrene-based thermoplastic elastomer and propylene-based polymer. For example, when a thermally conductive sheet comprising the composition is placed on a CPU, the operation of the CPU allows the thermally conductive sheet to be exposed to a cooling-heating cycle and this exposure makes the paraffin oil bleed out, leading to contamination of the electronic substrate including the CPU. In addition, the use of the propylene polymer which is a rigid component allows the sheet to lack flexibility. This provides poor proximity of the sheet to the CPU or heatsink and cannot allow the thermal conductivity the sheet originally has to develop effectively. As a result, the heat dissipation of the sheet is poor.

Patent Document 5 proposes that a filler such as alumina (aluminum oxide) is added to a styrene-based thermoplastic elastomer. This addition is intended to improve the thermal conductivity of the resin composition. However, the patent document does not describe use of zinc oxide as a filler to give the composition thermal conductivity, a preferred shape of the filler, or chips generated during production of the composition. Use of alumina having an amorphous or spherical shape, both of which are common alumina structures, provides the occurrence of chips due to alumina removal during strand or sheet cutting and this occurrence results in poor electrical insulation, causing failure of an electronic substrate.

Patent Document 6 proposes a product molded from a thermally conductive resin produced by mixing graphite into a thermoplastic resin. Simply mixing a large amount of graphite increases thermal conductivity greatly but reduces electrical insulation. For this reason, when the molded product is in contact with an electronic substrate, energization creates a short circuit, causing breakage of a semiconductor element. In addition, the product is not preferable because it is a material lacking the flexibility and toughness which a thermally conductive sheet is required to have. In contrast, mixing a small amount of graphite allows the product to maintain electrical insulation but have poor thermal conductivity. For this reason, the product is not sufficient as a thermally conductive material for semiconductor elements which have recently produced more heat.

Patent Document 7 discloses a molded product made from a thermally conductive material comprising a thermoplastic resin and a zinc oxide whisker. However, the patent document does not describe use of a flexible material and a paraffin oil, so the product is a material lacking flexibility and toughness. This lack provides poor proximity of the product to a cooling part and a heating element and cannot allow the thermal conductivity of the product to develop effectively, so the product is not suitable as a thermally conductive sheet.

Patent Document 1: Japanese Patent Laid-Open No. 1-225663
Patent Document 2: Japanese Patent Publication No. 7-51646
Patent Document 3: Japanese Patent Laid-Open No. 2003-277560
Patent Document 4: Japanese Patent Laid-Open No. 2003-49046
Patent Document 5: Japanese Patent Laid-Open No. 2002-206030
Patent Document 6: Japanese Patent Laid-Open No. 62-131033
Patent Document 7: Japanese Patent Laid-Open No. 2006-57064

DISCLOSURE OF THE INVENTION

Problems to be Solved by the Invention

The present invention has been made to solve the problems of thermally conductive materials above and an object thereof is to provide a thermally conductive material and a thermally conductive sheet molded therefrom characterized by having excellent thermal conductivity and electrical insulation as well as having flexibility and toughness.

Means for Solving the Problems

The present inventors have conducted intensive studies to solve the problems and found that a thermally conductive material comprising a hydrogenated copolymer having a specific structure and/or a modified hydrogenated copolymer having a specific structure and a zinc oxide comprising a core part and acicular crystal parts extended from the core part in four axial directions at a specific ratio and optionally further containing a paraffin oil, a flame retardant, or a filler having a thermal conductivity of from 10 to 400 W/m·K has excellent thermal conductivity and electrical insulation while retaining flexibility and toughness. The inventors have also found that a thermally conductive sheet molded from the thermally conductive material has excellent physical characteristics which the thermally conductive sheet is required to have. These findings have led the inventors to complete the invention.

More specifically, the present invention is:

[1]
a thermally conductive material comprising:
a hydrogenated copolymer (1) satisfying the following conditions (a) to (d) which is produced by hydrogenating a copolymer of a conjugated diene and a vinyl aromatic; and/or a modified hydrogenated copolymer (2) having at least one functional group and satisfying the following conditions (a) to (d), which is produced by hydrogenating a copolymer of a conjugated diene and a vinyl aromatic; and
a zinc oxide (3) comprising a core part and acicular crystal parts extending from the core in four different axial directions,
wherein the thermally conductive material does not comprise a paraffin oil (4) or a flame retardant (5), and satisfies the following conditions (A) and (B):
(a) a content of a vinyl aromatic unit is greater than 45 mass % and 90 mass % or less,
(b) a content of a polymer block comprising the vinyl aromatic is 40 mass % or less,
(c) a weight-average molecular weight is $5 \times 10^4$ to $100 \times 10^4$, and
(d) a degree of hydrogenation of double bonds based on the conjugated diene is 10% or more, and
based on 100 mass % of the thermally conductive material,
(A) a total content of the hydrogenated copolymer (1) and the modified hydrogenated copolymer (2), [(1)+(2)], is 10 mass % or more and 90 mass % or less, and
(B) a total content of the zinc oxide (3) having the core part and the acicular crystal parts extending from the core part in four different axial directions is 10 mass % or more and 90 mass % or less.

[2]
a thermally conductive material comprising:
a hydrogenated copolymer (1) satisfying the following conditions (a) to (d) which is produced by hydrogenating a copolymer of a conjugated diene and a vinyl aromatic; and/or a modified hydrogenated copolymer (2) having at least one functional group and satisfying the following conditions (a) to (d), which is produced by hydrogenating a copolymer of a conjugated diene and a vinyl aromatic;
a zinc oxide (3) comprising a core part and acicular crystal parts extending from the core in four different axial directions; and
a paraffin oil (4),
wherein the thermally conductive material does not comprise a flame retardant (5), and satisfies the following conditions (A) to (C):
(a) a content of a vinyl aromatic unit is greater than 45 mass % and 90 mass % or less,
(b) a content of a polymer block comprising the vinyl aromatic is 40 mass % or less,
(c) a weight-average molecular weight is $5 \times 10^4$ to $100 \times 10^4$, and (d) a degree of hydrogenation of double bonds based on the conjugated diene is 10% or more, and based on 100 mass % of the thermally conductive material, (A) a total content of the hydrogenated copolymer (1), the modified hydrogenated copolymer (2), and the paraffin oil (4), [(1)+(2)+(4)], is 10 mass % or more and 90 mass % or less, (B) a content of the zinc oxide (3) is 10 mass % or more and 90 mass % or less, and (C) a ratio of a mass of the paraffin oil (4) to a total mass of the hydrogenated copolymer (1) and the modified hydrogenated copolymer (2), [(4)/{(1)+(2)}], is greater than 0 and 2 or less.

[3]

a thermally conductive material comprising:

a hydrogenated copolymer (1) satisfying the following conditions (a) to (d) which is produced by hydrogenating a copolymer of a conjugated diene and a vinyl aromatic; and/or a modified hydrogenated copolymer (2) having at least one functional group and satisfying the following conditions (a) to (d), which is produced by hydrogenating a copolymer of a conjugated diene and a vinyl aromatic;

a zinc oxide (3) comprising a core part and acicular crystal parts extending from the core in four different axial directions;

a paraffin oil (4); and a flame retardant (5), wherein the thermally conductive material satisfies the following conditions (A) to (E):

(a) a content of a vinyl aromatic unit is greater than 45 mass % to 90 mass % or less, (b) a content of a polymer block comprising the vinyl aromatic is 40 mass % or less, (c) a weight-average molecular weight is $5 \times 10^4$ to $100 \times 10^4$, and (d) a degree of hydrogenation of double bonds based on the conjugated diene is 10% or more, and based on 100 mass % of the thermally conductive material, (A) a total content of the hydrogenated copolymer (1), the modified hydrogenated copolymer (2), and the paraffin oil (4), [(1)+(2)+(4)], is 10 mass % or more and 87 mass % or less, (B) a content of the zinc oxide (3) is 10 mass % or more and 87 mass % or less, (C) a ratio of a mass of the paraffin oil (4) to a total mass of the hydrogenated copolymer (1) and the modified hydrogenated copolymer (2), [(4)/{(1)+(2)}], is greater than 0 and 2 or less, (D) a content of the flame retardant (5) is 3 mass % or more and 30 mass % or less, and (E) a ratio of a mass of the flame retardant (5) to a total mass of the hydrogenated copolymer (1), the modified hydrogenated copolymer (2), and the paraffin oil (4), [(5)/{(1)+(2)+(4)}], is 0.2 or more and 3 or less.

[4]

a thermally conductive material comprising:

a hydrogenated copolymer (1) satisfying the following conditions (a) to (d) which is produced by hydrogenating a copolymer of a conjugated diene and a vinyl aromatic; and/or a modified hydrogenated copolymer (2) having at least one functional group and satisfying the following conditions (a) to (d), which is produced by hydrogenating a copolymer of a conjugated diene and a vinyl aromatic;

a zinc oxide (3) comprising a core part and acicular crystal parts extending from the core in four different axial directions;

a paraffin oil (4);

a flame retardant (5); and a filler having a thermal conductivity of 10 to 400 W/m·K (6) (excluding the zinc oxide (3)), wherein the thermally conductive material satisfies the following conditions (A) to (F):

(a) a content of a vinyl aromatic unit is greater than 45 mass % and 90 mass % or less, (b) a content of a polymer block comprising the vinyl aromatic is 40 mass % or less, (c) a weight-average molecular weight is $5 \times 10^4$ to $100 \times 10^4$, and (d) a degree of hydrogenation of double bonds based on the conjugated diene is 10% or more, and based on 100 mass % of the thermally conductive material, (A) a total content of the hydrogenated copolymer (1), the modified hydrogenated copolymer (2), and the paraffin oil (4), [(1)+(2)+(4)], is 10 mass % or more and 87 mass % or less, (B) a total content of the zinc oxide (3) and the filler (6), [(3)+(6)], is 10 mass % or more and 87 mass % or less, (C) a ratio of a mass of the paraffin oil (4) to a total mass of the hydrogenated copolymer (1) and the modified hydrogenated copolymer (2), [(4)/{(1)+(2)}], is greater than 0 and 2 or less, (D) a content of the flame retardant (5) is 3 mass % or more and 30 mass % or less, (E) a ratio of a mass of the flame retardant (5) to a total mass of the hydrogenated copolymer (1), the modified hydrogenated copolymer (2), and the paraffin oil (4), [(5)/{(1)+(2)+(4)}], is 0.2 or more and 3 or less, and (F) a ratio of a mass of the filler (6) to a total mass [(3)+(6)] of the zinc oxide (3) and the filler (6) is greater than 0 and less than 0.5.

[5]

the thermally conductive material according to any one of items [1] to [4], wherein the modified hydrogenated copolymer (2) has at least one functional group selected from a hydroxy group, an epoxy group, an amino group, a silanol group, and an alkoxysilane group.

[6]

the thermally conductive material according to any one of items [1] to [5], wherein the content of the vinyl aromatic polymer block in the hydrogenated copolymer (1) and/or the modified hydrogenated copolymer (2) is 10 to mass %.

[7]

the thermally conductive material according to any one of items [1] to [5], wherein the content of the vinyl aromatic polymer block in the hydrogenated copolymer (1) and/or the modified hydrogenated copolymer (2) is less than 10 mass %.

[8]

the thermally conductive material according to any one of items [1] to [7], wherein the hydrogenated copolymer (1) and/or the modified hydrogenated copolymer (2) has at least one structure selected from the following general formulas:

$$B; \qquad (i)$$

$$B\text{-}A; \qquad (ii)$$

$$B\text{-}A\text{-}B; \qquad (iii)$$

$$(B\text{-}A)_m\text{-}Z; \text{ and} \qquad (iv)$$

$$(B\text{-}A)_n\text{-}Z\text{-}A_p, \qquad (v)$$

(wherein B represents a random copolymer block of the conjugated diene and the vinyl aromatic, and A represents the vinyl aromatic polymer block. m is an integer of 2 or more, and each of n and p is an integer of 1 or more. Z represents a coupling agent residue.)

[9]
the thermally conductive material according to any one of items [1] to [8], wherein the modified hydrogenated copolymer (2) has at least one functional group selected from the following formulas (a) to (n):

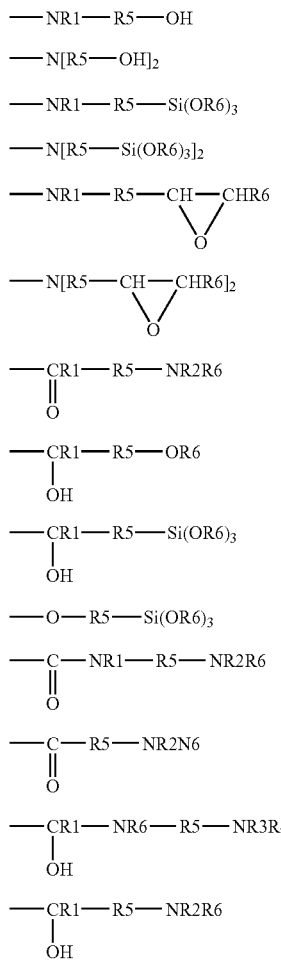

(wherein R1 to R4 independently represent hydrogen or a hydrocarbon group having a carbon number of 1 to 24, or a hydrocarbon group having a carbon number of 1 to 24 which has a functional group selected from a hydroxy group, an epoxy group, an amino group, a silanol group, and an alkoxysilane group. R5 represents a hydrocarbon chain having a carbon number of 1 to 48 or a hydrocarbon chain having a carbon number of 1 to 48 which has a functional group selected from a hydroxy group, an epoxy group, an amino group, a silanol group, and an alkoxysilane group. Elements such as oxygen, nitrogen, and silicon may bind to the hydrocarbon groups of R1 to R4 and the hydrocarbon chain of R5 in which a binding way that such elements do not take a form of a hydroxy group, an epoxy group, a silanol group, or an alkoxysilane group. R6 represents hydrogen or an alkyl group having a carbon number of 1 to 8.)

[10]
the thermally conductive material according to any one of items [1] to [9], wherein the modified hydrogenated copolymer (2) is obtained by allowing addition reaction to take place between a modifier containing a functional group and a living end of an unhydrogenated copolymer obtained with an organolithium compound as a polymerization catalyst and then hydrogenating the modified unhydrogenated copolymer (2) obtained.

[11]
the thermally conductive material according to any one of items [3] to [10], wherein a phosphorus-based flame retardant is contained as the flame retardant (5).

[12]
the thermally conductive material according to item [11], wherein the phosphorus-based flame retardant is phosphazene.

[13]
the thermally conductive material according to any one of items [4] to [12], wherein the filler (6) comprises at least one selected from silicon nitride, aluminum nitride, silicon carbide, boron nitride, and graphite.

[14]
the thermally conductive material according to any one of items [4] to [12], wherein the filler (6) comprises at least one selected from aluminum nitride and boron nitride.

[15]
the thermally conductive material according to any one of items [1], [2], and [5] to [14], wherein the content of the zinc oxide (3) is 65 mass % or more and 90 mass % or less based on 100 mass % of the thermally conductive material.

[16]
the thermally conductive material according to any one of items [3] to [14], wherein the thermally conductive material comprises a flame retardant (5) and the content of the zinc oxide (3) is 65 mass % or more and 87 mass % or less based on 100 mass % of the thermally conductive material.

[17]
a thermally conductive sheet having a thickness of 30 μm to 1 mm, which is obtained by molding from the thermally conductive material according to any one of items [1] to [16]

[18]
a thermally conductive sheet having a thickness of greater than 1 mm to 3 cm or less, which is obtained by molding from a thermally conductive material according to any one of items [1] to [16].

Advantages of the Invention

The present invention can provide a thermally conductive material and a thermally conductive sheet molded therefrom that are both characterized by having excellent thermal conductivity and electrical insulation as well as having flexibility and toughness.

BEST MODE FOR CARRYING OUT THE INVENTION

The present invention requires use of a hydrogenated copolymer (1) having a specific structure and/or a modified hydrogenated copolymer (2) having a specific structure and a zinc oxide (3) comprising a core part and acicular crystal parts extending from the core part in four different axial directions at a specific ratio. If the hydrogenated copolymer (1) having a specific structure and/or the modified hydrogenated copolymer (2) having a specific structure is contained at a specific ratio, the zinc oxide (3) comprising the core part and the acicular crystal parts extending from the core part in four different axial directions can be mixed in large amounts, providing the thermally conductive material and the thermally conductive sheet molded therefrom that both have excellent thermal conductivity. In addition, if the zinc oxide (3) comprising the core part and the acicular crystal parts extending from the core part in four different axial directions is used, the thermally conductive material and the thermally conductive sheet molded therefrom that both have excellent thermal conductivity can be obtained.

Moreover, if a paraffin oil (4) is contained at a specific ratio, the flexibility, thermal conductivity, and fabricability can be improved. In addition, if a flame retardant (5) is contained at a specific ratio, flame retardancy can be provided while other physical characteristics are almost entirely maintained. Furthermore, if a filler (6) (excluding the zinc oxide (3)) having a thermal conductivity of 10 to 400 W/m·K is contained at a specific ratio, a higher thermal conductivity can be provided.

The hydrogenated copolymer (1) and/or the modified hydrogenated copolymer (2) are produced by hydrogenating a copolymer of a conjugated diene and a vinyl aromatic. Hereinafter, a copolymer of a conjugated diene and a vinyl aromatic that can be hydrogenated into a hydrogenated copolymer (1) is referred to as an unhydrogenated copolymer (1); a copolymer of a conjugated diene and a vinyl aromatic that can be hydrogenated into a modified hydrogenated copolymer (2) is referred to as an a modified unhydrogenated copolymer (2); and a unhydrogenated copolymer (1) and a modified unhydrogenated copolymer (2) is collectively referred to as unhydrogenated copolymers.

A conjugated diene refers to a diolefin having a pair of conjugated double bonds. Examples thereof may include 1,3-butadiene, 2-methyl-1,3-butadiene (isoprene), 2,3-dimethyl-1,3-butadiene, 1,3-pentadiene, 2-methyl-1,3-pentadiene, 1,3-hexadiene, and the like, especially common conjugated dienes may include 1,3-butadiene, 2-methyl-1,3-butadiene (isoprene). These compounds may be used alone or in combination of two or more of them.

In addition, examples of the vinyl aromatic may include styrene, α-methylstyrene, p-methylstyrene, divinylbenzene, 1,1-diphenylethylene, N,N-dimethyl-p-aminoethylstyrene, N,N-diethyl-p-aminoethylstyrene and the like. These compounds may be used alone or in combination of two or more of them.

A content of the vinyl aromatic unit in each of the hydrogenated copolymer (1) and the modified hydrogenated copolymer (2) is greater than 45 mass % and 90 mass % or less, preferably greater than 45 mass % and 88 mass % or less, and more preferably greater than 45 mass % and 86 mass % or less. Any content in the above range can provide the thermally conductive material according to the present invention having excellent flexibility and toughness.

The content of the vinyl aromatic unit can be determined with an ultraviolet spectrophotometer, an infrared spectrophotometer, a nuclear magnetic resonance (NMR) apparatus, or the like.

The content of the polymer block comprising the vinyl aromatic in each of the hydrogenated copolymer (1) and the modified hydrogenated copolymer (2) is 40 mass % or less. In this case, the hydrogenated copolymer (1) and the modified hydrogenated copolymer (2) have good flexibility and blocking resistance.

If a hydrogenated copolymer (1) and a modified hydrogenated copolymer (2) having excellent blocking resistance are to be obtained, the content of the polymer block comprising the vinyl aromatic is preferably 10 to 40 mass %, more preferably 13 to 37 mass %, and much more preferably 15 to 35 mass %.

If a hydrogenated copolymer (1) and a modified hydrogenated copolymer (2) having excellent flexibility are to be obtained, the content of the polymer block comprising the vinyl aromatic is preferably less than 10 mass %, more preferably less than 8 mass %, and much more preferably less than 5 mass %.

The content of the polymer block comprising the vinyl aromatic can be determined as follows. The weight of a polymer block component comprising the vinyl aromatic (excluding a vinyl aromatic polymer component having an average degree of polymerization of about 30 or less) as determined, for example, by a method which oxidizes and degrades an unhydrogenated copolymer by tert-butylhydroperoxide with osmium tetraoxide as a catalyst (which is the method described in I. M. KOLTHOFF, et al., J. Polym. Sci. 1, 429 (1946)) can be used to calculate the content from the following equation.

Content of the polymer block comprising the vinyl aromatic (mass %)={(mass of the polymer block comprising the vinyl aromatic in an unhydrogenated copolymer (1) and/or a modified unhydrogenated copolymer (2))/(mass of the unhydrogenated copolymer (1) and/or the modified unhydrogenated copolymer (2))}×100

Note that the block content of the vinyl aromatic in each of the hydrogenated copolymer (1) and the modified hydrogenated copolymer (2) is preferably less than 40 mass %, more preferably 20 mass % or less, and much more preferably 18 mass % or less. As used herein, the term "block content" refers to a ratio of the amount of the vinyl aromatic polymer block to the total amount of the vinyl aromatic in the hydrogenated copolymer (1) or the modified hydrogenated copolymer (2). To obtain a composition having good flexibility, it is recommended that the block content be in the above range.

In addition to the polymer block comprising the vinyl aromatic, the hydrogenated copolymer (1) and the modified hydrogenated copolymer (2) each contain 5 mass % or more of a vinyl aromatic unit. If the content of the vinyl aromatic unit other than the polymer block comprising a vinyl aromatic is 5 mass % or more, such content is effective in improving the heat resistance of the hydrogenated copolymer (1) and the modified hydrogenated copolymer (2). Moreover, such content can inhibit the crystallization of parts other than the polymer block comprising the vinyl aromatic, providing good flexibility. Furthermore, such content allows a zinc oxide (3) and a filler (6) to be added in large amounts, providing good thermal conductivity.

The weight-average molecular weight of each of the hydrogenated copolymer (1) and the modified hydrogenated copolymer (2) is $5\times10^4$ to $100\times10^4$, preferably $10\times10^4$ to $80\times10^4$, and more preferably $13\times10^4$ to $50\times10^4$. If a hydrogenated copolymer (1) and a modified hydrogenated copolymer (2) having a content of the polymer block comprising the vinyl aromatic of 10 to 40 mass % is used, it is recommended that the weight-average molecular weight of each of them be greater than $10\times10^4$ and less than $50\times10^4$, preferably $13\times10^4$ to $40\times10^4$, and more preferably $15\times10^4$ to $30\times10^4$. A weight-average molecular weight of $5\times10^4$ or more provides good toughness and a weight-average molecular weight of $100\times10^4$ or less provides good flexibility, so the weight-average molecular weight in this range is preferable. Moreover, the weight-average molecular weight of $5\times10^4$ to $100\times10^4$ provides a low content of the volatile component because of a low content of the low-molecular-weight component. It is recommended that the molecular weight distribution (Mw/Mn) (ratio of weight-average molecular weight (Mw) to number-average molecular weight (Mn)) of each of the hydrogenated copolymer (1) and the modified hydrogenated copolymer (2) be preferably 1.01 to 8.0, more preferably 1.1 to 6.0, and much more preferably 1.1 to 5.0, in view of fabricability. The shape of the molecular weight distribution determined by gel permeation chromatography (GPC) is not particularly limited. The copolymers may have a polymodal molecular weight distribution where two or more peaks are present, but they preferably have a monomodal molecular weight distribution where a single peak is present.

The molecular weight of each of the hydrogenated copolymer (1) and the modified hydrogenated copolymer (2), which is the molecular weight corresponding to the peak on the chromatogram obtained from measurement by gel permeation chromatography (GPC), is the weight-average molecular weight determined by using a calibration curve created from the measurement of a commercially available standard polystyrene (prepared by using the peak molecular weight of the standard polystyrene). The molecular weight distributions of the hydrogenated copolymer (1) and the modified hydrogenated copolymer (2) can also be obtained in the same way from GPC measurement.

For the hydrogenated copolymer (1) and modified hydrogenated copolymer (2), the degree of hydrogenation of double bonds based on the conjugated diene in the respective unhydrogenated copolymers is 10% or more, preferably 75% or more, and much more preferably 85% or more. A degree of hydrogenation of 10% or more provides a good heat resistance without decreases in flexibility, strength, and elongation due to thermal degradation. If a thermally conductive material having excellent heat resistance is to be obtained, it is recommended that the degree of hydrogenation be preferably 85% or more, more preferably 90% or more, and much more preferably 95% or more. If a thermally conductive material having excellent weather resistance is to be obtained, it is recommended that the degree of hydrogenation be preferably 75% or more, more preferably 85% or more, and much preferably 90% or more. In addition, if crosslinking is necessary, it is recommended that the degree of hydrogenation be preferably 98% or less, more preferably 95% or less, and much more preferably 90% or less.

As used herein, the degree of hydrogenation of double bonds based on the conjugated diene refers to a ratio of the hydrogenated double bonds of each of the hydrogenated copolymer (1) and the modified hydrogenated copolymer (2) to the double bonds of the conjugated diene that each of the unhydrogenated copolymer (1) and the modified unhydrogenated copolymer (2) contains.

The degrees of hydrogenation of the hydrogenated copolymer (1) and the modified hydrogenated copolymer (2) can be determined with an infrared spectrophotometer, a nuclear magnetic resonance (NMR) apparatus, or the like.

Here, the degree of hydrogenation of the aromatic double bond based on the vinyl aromatic in a copolymer is not particularly limited, and preferably 50% or less, more preferably 30% or less, and much more preferably 20% or less.

The hydrogenated copolymer (1) and the modified hydrogenated copolymer (2) particularly preferably have at least one structure selected from the following general formulas (i) to (v). In addition, they may be a mixture having more than one structure represented by the following formulas at any ratio:

B; (i)

B-A; (ii)

B-A-B; (iii)

$(B-A)_m$-Z; and (iv)

$(B-A)_n$-Z-$A_p$ (v)

(wherein B represents a random copolymer block (hereinafter referred to as block B) of a conjugated diene and a vinyl aromatic, and A represents a vinyl aromatic polymer block (hereinafter referred to as block A). m is an integer of 2 or more, and each of n and p is an integer of 1 or more. Z represents a coupling agent residue.)

In the general formulas, the vinyl aromatic in block B may be distributed uniformly or in a tapered form. In addition, block B may have multiple parts where the vinyl aromatic is uniformly distributed and/or multiple parts where the vinyl aromatic is distributed in a tapered form. m is an integer of 2 or more, and preferably an integer of 2 to 10, and each of n and p is an integer of 1 or more, and preferably 1 to 10. The crystalline part in a copolymer can be minimized or eliminated by forming a random block B structure of a conjugated diene and a vinyl aromatic, allowing the zinc oxide (3) and/or the filler (6) to be mixed in large amounts.

The modified hydrogenated copolymer (2) has a functional group in a polymer chain. Examples of the functional group may include functional groups selected from a hydroxy group, a carboxy group, a carbonyl group, a thiocarbonyl group, an acid halide group, an acid anhydride group, a carboxylic acid group, a thiocarboxylic acid group, an aldehyde group, a tioaldehyde group, a carboxylic ester group, an epoxy group, a thioepoxy group, a sulfide group, an isocyanate group, an isothiocyanate group, an amide group, a sulfonic acid group, a sulfonic ester group, a phosphate group, a phosphate group, an amino group, an imino group, a nitrile group, a pyridyl group, a quinoline, a silicon halide group, a silanol group, an alkoxysilane group, a tin halide group, an alkoxy tin group, a phenyltin group, and the like. The copolymer preferably has at least one functional group selected from a hydroxy group, an amino group, an epoxy group, a silanol group, and an alkoxysilane group, and more preferably has at least one functional group selected from a hydroxy group, an amino group, and an epoxy group. In the present invention, the copolymer particularly preferably has a functional group selected from functional groups represented by the following general formulas.

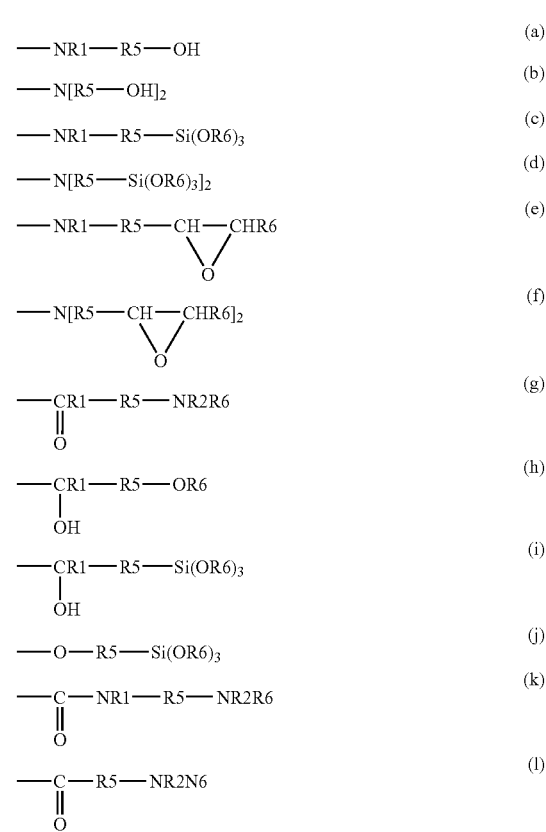

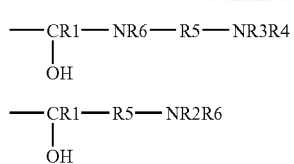

(wherein R1 to R4 independently represent hydrogen or a hydrocarbon group having a carbon number of 1 to 24, or a hydrocarbon group having a carbon number of 1 to 24 which has a functional group selected from a hydroxy group, an epoxy group, an amino group, a silanol group, and an alkoxysilane group. R5 represents a hydrocarbon chain having a carbon number of 1 to 48 or a hydrocarbon chain having a carbon number of 1 to 48 which has a functional group selected from a hydroxy group, an epoxy group, an amino group, a silanol group, and an alkoxysilane group. Here, a functional group containing elements such as oxygen, nitrogen, or silicon may bind to the hydrocarbon groups of R1 to R4 and the hydrocarbon chain of R5 in such a binding way that such an element does not take the form of a hydroxy group, an epoxy group, a silanol group, or an alkoxysilane group. R6 represents hydrogen or an alkyl group having a carbon number of 1 to 8.)

The modified hydrogenated copolymer (2) is obtained by reacting a modifier containing such a functional group with the polymerized copolymer.

A modified hydrogenated copolymer (2) can be obtained by allowing addition reaction to take place between the living end of an unhydrogenated copolymer obtained with an organolithium compound as a polymerization catalyst and a modifier containing a functional group and then hydrogenating the resulting copolymer.

Other methods for obtaining the modified hydrogenated copolymer (2) may include a method in which an organoalkaline metal compound such as an organolithium compound is reacted with a hydrogenated copolymer (1) (metallation reaction) and then addition reaction is allowed to take place between the copolymer to which the organoalkaline metal has been added and a modifier containing a functional group.

It is preferable that the hydrogenated copolymer (1) and/or the modified hydrogenated copolymer (2) show essentially no crystallization peak in the temperature range of from −50 to 100° C. when differential scanning calorimetry (DSC) is used. Herein, the phrase essentially no crystallization peak in the temperature range of from −50 to 100° C." refers to no peak appearing because of crystallization in this temperature range or the amount of heat required for crystallization at a peak being less than 3 J/g even if the peak due to crystallization is found. A zinc oxide (3) and/or a filler (6) can be mixed in large amounts by minimizing or eliminating the crystalline part. This is because the zinc oxide (3) and/or the filler (6) cannot enter the crystalline part.

At least one peak of loss tangent (tan δ) in a dynamic viscoelastic spectrum of the hydrogenated copolymer (1) and/or the modified hydrogenated copolymer (2) is preferably in a range of from −30 to 80° C., more preferably in a range of from −20 to 70° C., and much more preferably in a range of from −20 to 50° C. The peaks of tan δ present in a range of from −30 to 80° C. are due to block B. The presence of at least one peak of tan δ in the range of from −30 to 80° C. provides excellent flexibility and toughness.

The microscopic structure (ratio of the cis, trans, and vinyl content) of the conjugated diene part of the unhydrogenated copolymer (1) and the modified unhydrogenated copolymer (2) can be arbitrarily changed by the use of a polar compound as described later or the like and is not particularly limited. Generally, if 1,3-butadiene is used as a conjugated diene, the 1,2-vinyl bond content is 5 to 80% and preferably 10 to 60%, based on 100% of the conjugated diene part. If isoprene is used as a conjugated diene or if 1,3-butadiene and isoprene are used together, it is recommended that the total content of the 1,2-vinyl bond and the 3,4-vinyl bond be preferably 3 to 75% and more preferably 5 to 60%. Here, in the present invention, the total content of the 1,2-vinyl bond and the 3,4-vinyl bond (however, the 1,2-vinyl bond content when 1,3-butadiene is used as a conjugated diene) is hereinafter referred to as the vinyl bond content.

The vinyl bond content based on the conjugated diene of the unhydrogenated copolymer (1) and the modified unhydrogenated copolymer (2) can be determined with an infrared spectrophotometer (e.g., the Hampton technique), a nuclear magnetic resonance (NMR) apparatus, or the like.

In addition, it is recommended that the difference between the maximum and minimum of the vinyl bond content in molecular chains in the unhydrogenated copolymer (1) and the modified unhydrogenated copolymer (2) be preferably less than 10%, more preferably 8% or less, and much more preferably 6% or less. The vinyl bond in the copolymer chains may be distributed uniformly or in a tapered form. Here, the difference between the maximum and minimum of the vinyl bond content refers to a difference between the maximum and minimum of the vinyl bond content as determined by polymerization conditions, more specifically the type and amount of a vinyl content adjusting agent and polymerization temperature.

The difference between the maximum and minimum of the vinyl bond content in the conjugated diene polymer chain can be controlled, for example, by polymerization temperature during the polymerization of the conjugated diene or during the copolymerization of the conjugated diene and the vinyl aromatic. If the type and amount of a vinyl content adjusting agent such as a tertiary amine compound or an ether compound are constant, the content of vinyl bonds incorporated in polymer chains being polymerized is determined by polymerization temperature. Therefore, an isothermally polymerized polymer is a polymer in which the vinyl bonds are uniformly dispersed. In contrast, a polymer polymerized at elevated temperature is a polymer having a difference in the vinyl bond content in molecular chains, for example, initially (low temperature polymerization) a high vinyl bond content and later (high temperature polymerization) a low vinyl bond content. By hydrogenating a copolymer having such a structure, a hydrogenated copolymer (1) and a modified hydrogenated copolymer (2) having a difference in the vinyl bond content in molecular chains are obtained.

In the present invention, an unhydrogenated copolymer is obtained, for example, by anionic living polymerization in a hydrocarbon solvent using an initiator such as an organoalkaline metal compound. Examples of the hydrocarbon solvent may include aliphatic hydrocarbons such as n-butane, isobutane, n-pentane, n-hexane, n-heptane, and n-octane, alicyclic hydrocarbons such as cyclohexane, cycloheptane, and methylcycloheptane, and aromatic hydrocarbons such as benzene, toluene, xylene, and ethyl benzene.

In addition, examples of the initiator may include aliphatic hydrocarbon alkali metal compounds, aromatic hydrocarbon alkali metal compounds, and organic amino alkali metal compounds that are all known to have anionic polymerization activity for a conjugated diene and a vinyl aromatic. Examples of an alkali metal contained in the initiator may include lithium, sodium, and potassium. Preferable organoalkaline metal compounds are aliphatic and aromatic hydrocarbon lithium compounds having a carbon number of 1 to 20 and may include compounds containing one lithium atom per a molecule, and dilithium compounds, trilithium compounds, and tetralithium compounds containing two or more lithium atoms per a molecule.

Examples of the preferable organoalkaline metal compounds may include n-propyllithium, n-butyllithium, sec-butyllithium, tert-butyllithium, n-pentyllithium, n-hexyllithium, benzillithium, phenyllithium, tolyllithium, a reaction product of diisopropenylbenzene and sec-butyllithium, and a reaction product of divinylbenzene, sec-butyllithium, and a small amount of 1,3-butadiene. A lithium compound disclosed in U.S. Pat. No. 5,708,092 in which 1-(t-butoxy)propyllithium and an isoprene monomer of one or a few molecules for improved solubility of the lithium compound are inserted; siloxy group-containing alkyllithium such as 1-(t-butyldimethylsiloxy)hexyllithium disclosed in British Patent No. 2,241,239; and aminolithiums such as amino group-containing alkyllithium, lithium diisopropylamide, and lithium hexamethyldisilazide disclosed in U.S. Pat. No. 5,527,753 can also be used.

In the present invention, when a conjugated diene and a vinyl aromatic are copolymerized with an organoalkaline metal compound as an polymerization initiator, a tertiary amine compound or an ether compound can be added as an adjusting agent to adjust the content of the vinyl bonds (1,2-bond or 3,4-bond) derived from the conjugated diene to be incorporated in the polymer and the random copolymerization of the conjugated diene and the vinyl aromatic.

The tertiary amine compound is a compound represented by the general formula $R_1R_2R_3N$ (wherein $R_1$, $R_2$, and $R_3$ independently represent a hydrocarbon group having a carbon number of 1 to 20 or a hydrocarbon group having a tertiary amino group.). Examples thereof may include trimethylamine, triethylamine, tributylamine, N,N-dimethylaniline, N-ethylpiperidine, N-methylpyrrolidine, N,N,N',N'-tetramethylethylenediamine, N,N,N',N'-tetraethylethylenediamine, 1,2-dipiperidinoethane, trimethylaminoethylpiperazine, and N,N,N',N'',N''-pentamethylethylenetriamine, N,N'-dioctyl-p-phenylenediamine.

The ether compound is selected from linear-chain ether compounds and cyclic ether compounds.

Examples of the linear-chain ether compounds may include dialkyl ether compounds of ethylene glycol such as dimethyl ether, diethyl ether, diphenyl ether, ethylene glycol dimethyl ether, ethylene glycol diethyl ether, and ethylene glycol dibutyl ether; and dialkyl ether compounds of diethylene glycol such as diethylene glycol dimethyl ether, diethylene glycol diethyl ether, and diethylene glycol dibutyl ether.

Examples of the cyclic ether compounds may include tetrahydrofuran, dioxane, 2,5-dimethyloxolane, 2,2,5,5-tetramethyloxolane, 2,2-bis(2-oxolanyl)propane, and alkyl ether of furfuryl alcohol.

The method which copolymerizes a conjugated diene and a vinyl aromatic with an organoalkaline metal compound as a polymerization initiator in the present invention may be batch polymerization, continuous polymerization, or a combination thereof. Especially, continuous polymerization is recommended for adjusting the molecular weight distribution to an appropriate range. Polymerization temperature is generally 0° C. to 180° C., preferably 30° C. to 150° C. The time taken for polymerization varies depending on the conditions and usually 48 hours or less, and more preferably 0.1 to 10 hours. In addition, polymerization is preferably performed in an atmosphere of an inert gas such as nitrogen gas. Polymerization pressure should be in a range of pressure that is enough to maintain the monomer and solvent in liquid phase in the polymerization temperature range and is not particularly limited. Moreover, care should be taken to prevent impurities such as water, oxygen, and carbon dioxide that may inactivate the catalyst and living polymer from entering the polymerization system.

On completion of polymerization, coupling reaction can be allowed to take place by adding a required amount of a bifunctional or higher functional coupling agent. Any known bifunctional coupling agent can be used and is not particularly limited. Examples thereof may include dihalogen compounds such as dimethyldichlorosilane and dimethyldibromosilane; and acid esters such as methyl benzoate, ethyl benzoate, phenyl benzoate, and phthalate esters.

In addition, any known trifunctional or higher functional polyfunctional coupling agent can be used and is not particularly limited. Examples thereof may include trivalent or higher valent polyalcohols; epoxidized soybean oil; polyvalent epoxy compounds such as diglycidyl bisphenol A; halogenated silicon compounds represented by the general formula $R_{(4-n)}SiX_n$ (wherein R represents a hydrocarbon group having a carbon number of 1 to 20, X represents a halogen, and n is 3 or 4); and halogenated tin compounds. Examples of the halogenated silicon compounds may include methylsilyltrichloride, t-butylsilyltrichloride, silicon tetrachloride, and bromides thereof. Examples of the halogenated tin compounds may include methyltintrichloride, t-buthyltintrichloride, and polyvalent halides such as tin tetrachloride. Dimethyl carbonate, diethyl carbonate and the like can also be used.

In the present invention, a modifier used to obtain a modified hydrogenated copolymer (2) having at least one functional group selected from a hydroxy group, an epoxy group, an amino group, a silanol group, and an alkoxysilane group is exemplified by the modifier described in Japanese Patent Publication No. 4-39495 or the following.

According to claim 9, examples of modifiers having functional groups represented by the general formulas (a) to (f) may include tetraglycidyl-m-xylenediamine, tetraglycidyl-1,3-bisaminomethylcyclohexane, tetraglycidyl-p-phenylenediamine, tetraglycidyldiaminodiphenylmethane, diglycidylaniline, diglycidyl-o-toluidine, N-(1,3-dibutylbutylidene)-3-(triethoxysilyl)-1-propaneamine, 4-di(β-trimethoxysilylethyl)aminostyrene, 4-di(β-triethoxysilylethyl)aminostyrene, 4-di(β-triethoxysilylpropyl)aminostyrene, and 4-di(γ-triethoxysilylpropyl)aminostyrene;

Examples of a modifier having a functional group represented by the formula (g) may include cyclic lactones such as ε-caprolactone, δ-valerolactone, butyrolactone, γ-caprolactone, and γ-valerolactone;

Examples of a modifier having a functional group represented by the formula (h) may include 4-methoxybenzophenone, 4-ethoxybenzophenone, 4,4'-bis(methoxy)benzophenone, 4,4'-bis(ethoxy)benzophenone, γ-glycidoxypropyltripropoxysilane, and γ-glycidoxypropyltributoxysilane;

Examples of modifiers having functional groups represented by the formulas (i) and (j) may include γ-glycidoxyethyltrimethoxysilane, γ-glycidoxypropyltrimethoxysilane, γ-glycidoxybutyltrimethoxysilane, γ-glycidoxypropyltriethoxysilane, γ-glycidoxypropyltripropoxysilane, γ-glycidoxypropoxytributoxysilane, γ-glycidoxypropyltriphenoxysilane and the like;

γ-glycidoxypropyl methyl dimethoxysilane, γ-glycidoxypropylethyldimethoxysilane, γ-glycidoxypropylethyldiethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropyldimethylmethoxysilane, γ-glycidoxypropyldiethylethoxysilane, γ-glycidoxypropyldimethylethoxysilane, γ-glycidoxypropyldimethylphenoxysilane, γ-glycidoxypropyldiethylmethoxysilane, γ-glycidoxypropyl methyldiisopropenoxysilane, and the like;

bis(γ-glycidoxypropyl)dimethoxysilane, bis(γ-glycidoxypropyl)diethoxysilane, bis(γ-glycidoxypropyl)dipropoxysilane, bis(γ-glycidoxypropyl)dibutoxysilane, bis(γ-glycidoxypropyl)diphenoxysilane, bis(γ-glycidoxypropyl)methylmethoxysilane, bis(γ-glycidoxypropyl)methylethoxysilane, bis(γ-glycidoxypropyl)methylpropoxysilane, bis(γ-glycidoxypropyl)methylbutoxysilane, bis(γ-glycidoxypropyl)methylphenoxysilane, and the like;

tris(γ-glycidoxypropyl)methoxysilane, γ-methacryloxypropyltrimethoxysilane, γ-methacryloxypropyltriethoxysilane, γ-methacryloxymethyltrimethoxysilane, γ-methacryloxyethyltriethoxysilane, bis(γ-methacryloxypropyl)dimethoxysilane, tris(γ-methacryloxypropyl)methoxysilane, and the like;

β-(3,4-epoxycyclohexyl)ethyl-trimethoxysilane, β-(3,4-epoxycyclohexyl)ethyl-triethoxysilane, β-(3,4-epoxycyclohexyl)ethyl-tripropoxysilane, β-(3,4-epoxycyclohexyl)ethyl-tributoxysilane, β-(3,4-epoxycyclohexyl)ethyl-triphenoxysilane, β-(3,4-epoxycyclohexyl)propyl-trimethoxysilane, β-(3,4-epoxycyclohexyl)ethyl-methyldimethoxysilane, β-(3,4-epoxycyclohexyl)ethyl-ethyldimethoxysilane, and the like;

β-(3,4-epoxycyclohexyl)ethyl-ethyldiethoxysilane, β-(3,4-epoxycyclohexyl)ethyl-methyldiethoxysilane, β-(3,4-epoxycyclohexyl)ethyl-methyldipropoxysilane, β-(3,4-epoxycyclohexyl)ethyl-methyldibutoxysilane, β-(3,4-epoxycyclohexyl)ethyl-methyldiphenoxysilane, β-(3,4-epoxycyclohexyl)ethyl-dimethylmethoxysilane, β-(3,4-epoxycyclohexyl)ethyl-diethylethoxysilane, and the like;

β-(3,4-epoxycyclohexyl)ethyl-dimethylethoxysilane, β-(3,4-epoxycyclohexyl)ethyl-dimethylpropoxysilane, β-(3,4-epoxycyclohexyl)ethyl-dimethylbutoxysilane, β-(3,4-epoxycyclohexyl)ethyl-dimethylphenoxysilane, β-(3,4-epoxycyclohexyl)ethyl-diethylmethoxysilane, β-(3,4-epoxycyclohexyl)ethyl-methyldiisopropenoxysilane, and the like;

Examples of a modifier having a functional group represented by formula (k) may include 1,3-dimethyl-2-imidazolidinone and 1,3-diethyl-2-imidazolidinone;

Examples of a modifier having a functional group represented by formula (l) may include N,N'-dimethylpropyleneurea and N-methylpyrrolidone;

wherein modified hydrogenated copolymers (2) having functional groups represented by formulas (m) and (n) are obtained by hydrogenating modified unhydrogenated copolymers (2) having functional groups represented by formulas (k) and (l), respectively.

Depending on the type of the modifier, when the modifier is reacted, a hydroxy group, an amino group, and the like may generally become organometallic salts. In this case, these salts can be converted into a hydroxy group, an amino group, and the like by treating them with a compound having active hydrogen such as water or alcohol.

The hydrogenation catalyst used to produce a hydrogenated copolymer (1) and a modified hydrogenated copolymer (2) is not particularly limited and the following catalysts, which have been known, are used: (1) supported nonuniform hydrogenation catalysts where a metal such as Ni, Pt, Pd, or Ru is supported on carbon, silica, alumina, siliceous earth, or the like; (2) so-called Ziegler hydrogenation catalysts using an organic salt of Ni, Co, Fe, Cr, or the like or a transition metal salt such as acetylacetone salt and a reducing agent such as organoaluminum; and (3) uniform hydrogenation catalysts including a so-called organometallic complex such as an organometallic compound of Ti, Ru, Rh, Zr, or the like, and so on.

As specific hydrogenation catalysts, the hydrogenation catalysts described in Japanese Patent Publication No. 42-8704, Japanese Patent Publication No. 43-6636, Japanese Patent Publication No. 63-4841, Japanese Patent Publication No. 1-37970, Japanese Patent Publication No. 1-53851, and Japanese Patent Publication No. 2-9041 can be used. Preferable hydrogenation catalysts may include a mixture with a titanocene compound and/or a reducing organometallic compound. As a titanocene compound, the compound described in Japanese Patent Laid-Open No. 8-109219 can be used. Specific examples thereof may include compounds having at least one ligand having a (substituted) cyclopentadienyl structure, an indenyl structure, or a fluorenyl structure, such as biscyclopentadienyltitanium dichloride and monopentamethylcyclopentadienyltitanium trichloride. In addition, examples of a reducing organometallic compound may include organoalkaline metal compounds such as organolithium, organomagnesium compounds, organoaluminum compounds, organoboron compounds, and organozinc compounds.

Hydrogenation reaction is generally performed in the temperature range of from 0 to 200° C., and more preferably from 30 to 150° C. It is recommended that the hydrogen pressure used for hydrogenation reaction be preferably 0.1 to 15 MPa, more preferably 0.2 to 10 MPa, and much more preferably 0.3 to 5 MPa. In addition, hydrogenation reaction time is usually 3 minutes to 10 hours, preferably 10 minutes to 5 hours. Hydrogenation reaction can be performed in a batch process, in a continuous process, or in combination thereof.

The hydrogenated copolymer (1) and the modified hydrogenated copolymer (2) can be separated from the solvent by removing the catalyst residue from the reaction solution after hydrogenation reaction as needed. Examples of a separation method for this purpose may include a method which precipitates polymers by adding a polar solvent that is a poor solvent for the polymers, such as acetone or alcohol, to the solution after hydrogenation and recovers the polymers, a method which places a solution of the hydrogenated copolymer (1) and the modified hydrogenated copolymer (2) in boiled water under stirring to remove the solvent by steam stripping and recovers the polymers, and a method which directly heats a polymer solution to distil away the solvent.

Moreover, various stabilizers such as phenolic stabilizers, phosphorous stabilizers, sulfur stabilizers, and amine stabilizers can be added to the hydrogenated copolymer (1) and the modified hydrogenated copolymer (2).

If styrene-ethylene/butylene-styrene (SEBS) that is a styrene hydrogenated thermoplastic elastomer having a block structure is used instead of the hydrogenated copolymer (1) and/or the modified hydrogenated copolymer (2), the zinc oxide (3) cannot be mixed in large amounts because of the presence of crystals in the ethylene/butylene part, providing poor thermal conductivity. In addition, if a different thermoplastic resin, such as a polypropylene resin, is used, the flexibility the thermally conductive material is required to have is poor as well as the thermal conductivity is also poor because the zinc oxide (3) cannot be mixed in large amounts.

The zinc oxide (3) is a zinc oxide having a core part and acicular crystal parts extending from the core part in four different axial directions. Examples thereof may include Pana-Tetra (trade name) from AMTEC Co., Ltd. For such a zinc oxide having a core part and acicular crystal parts extending from the core part in four different axial directions, many contacts of the zinc oxide in a resin are produced, allowing a heat conduction path to be easily formed and thereby excellent thermal conductivity to develop.

In addition, the zinc oxide (3) has a relatively greater particle size than other fillers have, and a greater area in contact with the hydrogenated copolymer (1) and/or the modified hydrogenated copolymer (2) due to crystals extending in four different axial directions, making it difficult for the zinc oxide to fall because of the anchor effect. For these reasons, it is possible to reduce chips during fabrication greatly and thereby reduce the failure of electronic substrates due to poor insulation.

The diameter of the base of acicular crystal parts in the zinc oxide (3) is preferably 0.7 to 14 μm, and the length between the base of acicular crystal parts and an end thereof is preferably 3 to 200 μm. The diameter of the base of acicular crystal parts is more preferably 1 to 14 μm and the length between the base of acicular crystal parts and an end thereof is more preferably 10 to 200 μm. Here, the diameter of the base refers to the diameter of acicular crystal parts in the joints between a core part and the acicular crystal parts.

In the structure of the zinc oxide (3), the angle between one of the acicular crystal parts extending from the core part which is used as reference and each of the other acicular crystal parts extending in directions different from the direction in which the acicular crystal part extends is preferably in a range of from 90° to 140°, more preferably in a range of from 100° to 120°. The angle is most preferably 109.5° at which the acicular crystal parts extend in equally spaced directions like a tetrapod.

The zinc oxide (3) according to the present invention also includes a zinc oxide having a core part and acicular crystal parts extending from the core part in four different axial directions where the zinc oxide is surface-treated with a coupling agent. As such a coupling agent, a silane coupling agent, a titanate coupling agent, an aluminum coupling agent are preferably used.

In addition, the thermally conductive material according to the present invention may contain an acicular zinc oxide, but this type of acicular zinc oxide is caused by the breakage of the acicular crystal parts extending in four axial directions of the zinc oxide (3), without any damage to the major characteristics of the present invention.

The use of the zinc oxide (3) provides better thermal conductivity than the use of amorphous and spherical zinc oxides. Also, the use of the zinc oxide (3) makes it difficult to produce chips and thereby cause poor insulation.

However, zinc oxides other than the zinc oxide (3), such as granular zinc oxide and spherical zinc oxide, can also be used in amounts that do not impair the object of the present invention.

The paraffin oil (4) refers to a lubricant base oil obtained by hydrogenating and refining a petroleum fraction or residual oil or cracking it where the number of carbon atoms of the paraffin chains accounts for 50% or more of all carbon atoms. When a thermally conductive material or a thermally conductive sheet is produced, the paraffin oil (4) is used to mix the zinc oxide (3) in large amounts and to provide a thermally conductive material obtained by melting and kneading and a thermally conductive sheet molded from the thermally conductive material with higher thermal conductivity and give them flexibility.

The kinematic viscosity of the paraffin oil (4) at 40° C. is 100 mm$^2$/s or more, preferably 100 to 10,000 mm$^2$/s, and much more preferably 200 to 5,000 mm$^2$/s.

Examples of the paraffin oil (4) may include NA Solvent (trade name) from Nippon Oil & Fats Co., Ltd., Diana (registered trademark) Process Oils PW-90 and PW-380 from Idemitsu Kosan Co., Ltd., IP Solvent 2835 (trade name) from Idemitsu Petrochemical Co., Ltd., and Neotiozol (trade name) from Sanko Kagaku Kogyo K.K.

In addition to the paraffin oil (4), naphthenic oils where the number of carbon atoms in the naphthene ring is 30 to 45%, aromatic oils where the number of aromatic carbon atoms exceeds 30%, castor oil, linseed oil, polybutene, low-molecular-weight polybutadiene, liquid paraffin, or the like can be used to provide flexibility in amounts that do not impair the object of the present invention.

Examples of the flame retardant (5) may include halogen-based flame retardants, metal hydroxide-based flame retardants, phosphorus-based flame retardants, and silicon-based flame retardants.

Examples of the halogen-based flame retardants may include the following.

Examples of chlorine-based flame retardants may include chlorinated paraffin, chlorinated polyethylene, and perchlorocyclopentadecane.

Examples of bromine-based flame retardants may include hexabromocyclododecane (HBCD), decabromodiphenyloxide (DBDPO), octabromodiphenyloxide, tetrabromobisphenol A (TBBA), bis(tribromophenoxy)ethane, bis(pentabromophenoxy)ethane (BPBPE), tetrabromobisphenol A epoxy resin (TBBA epoxy), tetrabromobisphenol A carbonate (TBBA-PC), ethylene(bistetrabromophthal)imide (EBT-BPI), ethylenebispentabromodiphenyl, tris(tribromophenoxy)triazine (TTBPTA), bis(dibromopropyl)tetrabromobisphenol A (DBP-TBBA), bis(dibromopropyl) tetrabromobisphenol S (DBP-TBBS), tetrabromobisphenol S (TBBS), tris(tribromoneopentyl)phosphate (TTBNPP), polybromotrimethylphenylindane (PBPI), and tris(dibromopropyl)-isocyanurate (TDBPIC).

Among the halogen-based flame retardants above, bromine-based flame retardants are preferable to allow the flame retardancy of the thermally conductive material according to the present invention to develop when they are added in small amounts. To improve the dispersion of the flame retardants, bromine-based flame retardants having a melting point of 50 to 150° C. are more preferable. To prevent the bleed-out of the flame retardants, bis(dibromopropyl)tetrabromobisphenol A (DBP-TBBA) is much more preferable.

Examples of the metal hydroxide-based flame retardants may include magnesium hydroxide and aluminum hydroxide. Surface-treated metal hydroxides can also be used. Specific examples thereof may include magnesium hydroxide and aluminum hydroxide which are surface-treated with stearic acid, fatty acid, titanic acid, a silane coupling agent, a nitric compound, or the like. Among these, aluminum hydroxide surface-treated with a nitric compound is more preferable. This is because aluminum hydroxide is non-halogen-based and non-phosphorous, allowing environmentally-friendly flame retardancy to develop, a more highly endothermic reaction at low temperature to take place than other metal hydroxide flame retardants, flame retardancy to develop with the use of a small amount, and flexibility and toughness to be retained. Examples of the nitric compound used here may include methyl nitrate, ethyl nitrate, butyl nitrate, isopropyl nitrate, isobutyl nitrate, ammonium nitrate, lithium nitrate, sodium nitrate, potassium nitrate, cesium nitrate, magnesium nitrate, calcium nitrate, iron nitrate, nickel nitrate, copper nitrate, zinc nitrate, guanidine nitrate, cellulose nitrate, hydroxyammonium nitrate, methyl nitrite, ethyl nitrite, butyl nitrite, isopropyl nitrite, isobutyl nitrite, ammonium nitrite, lithium nitrite, sodium nitrite, potassium nitrite, cesium nitrite, magnesium nitrite, calcium nitrite, iron nitrite, nickel nitrite, copper nitrite, and zinc nitrite. Two or more of these nitric compounds may be mixed. Ammonium nitrate is more preferable in view of degradation temperature and resin coloration protection. Examples of the aluminum hydroxide surface-treated with a nitric compound may include Pyrolyzer (registered trademark) HG (aluminum hydroxide surface-treated with ammonium nitrate) from Ishizuka Glass Co., Ltd.

The average particle size of the metal hydroxide-based flame retardants is preferably in a range of from 0.1 μm to 5 μm, and more preferably in a range of from 0.5 μm to 3 μm, in view of mechanical strength and toughness retention.

Examples of the phosphorus-based flame retardants may include phosphazene compounds, phosphate ester, condensed phosphate ester, phosphinate, and tertiary phosphines, and further include red phosphorus-based compounds, phosphonate, phosphate ester amide, phosphorus-containing polymers, phosphine oxide, and phosphine sulfide.

Among the phosphorus-based flame retardants above, phosphazene compounds are preferable in view of flame retardancy and safety. These compounds can be used alone or as a mixture of two or more of them.

The water content of the phosphorus-based flame retardants is preferably 1000 ppm or less, more preferably 800 ppm or less, much more preferably 650 ppm or less, still more preferably 500 ppm or less, and yet more preferably 300 ppm or less, in view of electrical characteristics, hydrolysis resistance, and the like. The acid value as determined according to JIS K6751 is preferably 1.0 or less, and more preferably 0.5 or less.

In addition, the water solubility (solubility after a sample is mixed into distilled water at a concentration of 0.1 g/mL and the mixture is stirred at room temperature for 1 hour) of the phosphorus-based flame retardants is preferably 100 ppm or less, more preferably 50 ppm or less, and much more preferably 25 ppm or less, in view of hydrolysis resistance and moisture absorption resistance.

With the phosphorus-based flame retardants, when they are heated in an inert gas atmosphere at a rate of temperature rise of 10° C./min from room temperature to 600° C., the difference between the temperature at which a decrease in mass is 50 mass % and the temperature at which a decrease in mass is 5 mass %, as determined according to thermogravinetric analysis (TGA), is preferably 20 to 150° C., and more preferably 20 to 120° C., in view of flame retardancy, low smoke emission during burning, low volatility, and the like. If the phosphorus-based flame retardants are used for resins, the temperature at which a decrease in mass is 50 mass. % is preferably 320 to 500° C., and more preferably 350 to 460° C., in view of flame retardancy efficiency due to the effect of accelerating char layer formation during burning.

The phosphorus-based flame retardants can also take various forms such as liquid form, wax form, and solid form, depending on the differences in the type and structure of the substituent group contained. Any form is possible unless it impairs the advantages of the present invention.

If the heat resistance and low volatility of the phosphorus-based flame retardants themselves need to be considered, phosphazene compounds, phosphate ester, condensed phosphate ester, tertiary phosphines, and phosphinate are more preferably used among the phosphorus-based flame retardants that can preferably be used for the present invention. If hydrolysis resistance further needs to be considered, phosphazene compounds are more preferably used.

Any known phosphazene compounds can be widely used. The structure of phosphazene compounds preferably used for the present invention is described, for example, in James E. Mark, Harry R. Allcock, Robert West, Inorganic Polymers, Prentice Hall International, Inc., 1992, pp. 61-140. Examples of the phosphazene compounds may include cyclic phosphazene compounds represented by the following general formula (1) and/or chain phosphazene compounds represented by the following general formula (2). Among them, compounds containing 95 mass % or more of phosphazene compounds having these structures are preferable.

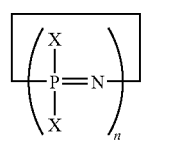

(1)

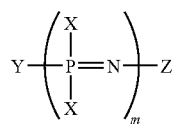

(2)

(wherein n is an integer of 3 to 25, and m is an integer of 3 to 10,000. The substituent group X's represent a substituent group selected from the substituent groups represented by an alkyl group having a carbon number of 1 to 6, an aryl group having a carbon number of 6 to 11, a fluorine atom, an aryloxy group having a substituent group represented by the following general formula (3), a naphthyloxy group, and an alkoxy group and alkoxy-substituted alkoxy group having a carbon number of 1 to 6, and they may be different or the same. Part or the whole of the hydrogen on the substituent group may be substituted with fluorine. In addition, Y in the lower formula represents $-N=P(O)(X)$ or $-N=P(X)_3$, and Z represents $-P(X)_4$ or $-P(O)(X)_2$.)

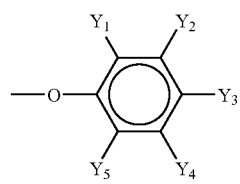

(3)

(wherein $Y_1$, $Y_2$, $Y_3$, $Y_4$, and $Y_5$ independently represent a substituent group selected from the group consisting of a hydrogen atom, a fluorine atom, an alkyl or alkoxyl group having a carbon number of 1 to 5, a phenyl group, and hetero element-containing groups.)

Examples of the substituent group X in the phosphazene compounds may include alkyl groups such as a methyl group, an ethyl group, an n-propyl group, an isopropyl group, an n-butyl group, an s-butyl group, a tert-butyl group, an n-amyl group, and an isoamyl group; aryl groups such as a phenyl group, 2-methylphenyl group, 3-methylphenyl group, 4-methylphenyl group, 2,6-dimethylphenyl group, 3,5-dimethylphenyl group, 2,5-dimethylphenyl group, 2,4-dimethylphenyl group, 3,4-dimethylphenyl group, 4-tert-butylphenyl group, and 2-methyl-4-tert-butylphenyl group; alkoxy groups such as a methoxy group, an ethoxy group, an n-propyloxy group, an isopropyloxy group, an n-butyloxy group, a tert-butyloxy group, an s-butyloxy group, an n-amyloxy group, an isoamyloxy group, a tert-amyloxy group, and an n-hexyloxy group; alkoxy-substituted alkoxy groups such as a methoxymethoxy group, a methoxyethoxy group, a methoxyethoxymethoxy group, a methoxyethoxyethoxy group, and a methoxypropyloxy group; alkyl-substituted phenoxy groups such as a phenoxy group, a 2-methylphenoxy group, a 3-methylphenoxy group, a 4-methylphenoxy group, a 2,6-dimethylphenoxy group, a 2,5-dimethylphenoxy group, a 2,4-dimethylphenoxy group, a 3,5-dimethylphenoxy group, a 3,4-dimethylphenoxy group, a 2,3,4-trimethylphenoxy group, a 2,3,5-trimethylphenoxy group, a 2,3,6-trimethylphenoxy group, a 2,4,6-trimethylphenoxy group, a 2,4,5-trimethylphenoxy group, a 3,4,5-trimethylphenoxy group, a 2-ethylphenoxy group, a 3-ethylphenoxy group, a 4-ethylphenoxy group, a 2,6-diethylphenoxy group, a 2,5-diethylphenoxy group, a 2,4-diethylphenoxy group, a 3,5-diethylphenoxy group, a 3,4-diethylphenoxy group, a 4-n-propylphenoxy group, a 4-isopropylphenoxy group, a 4-tert-butylphenoxy group, a 2-methyl 4-tert-butylphenoxy group, a 2-phenylphenoxy group, a 3-phenylphenoxy group, and a 4-phenylphenoxy group; and an aryl-substituted phenoxy group, a naphthyl group, and a naphthyloxy group. Part or the whole of the hydrogen in these groups may be substituted with fluorine and/or a hetero element-containing group.

The hetero element-containing group refers to a group containing a B, N, O, Si, P, or S atom. Examples thereof may include a group containing an amino group, an amide group, an aldehyde group, a glycidyl group, a carboxy group, a hydroxy group, a mercapto group, a silyl group, or the like.

Moreover, these phosphazene compounds may be crosslinked with a crosslinking group selected from the group consisting of a phenylene group, a biphenylene group, and a group represented by the following formula (4) by means of the technique disclosed in International Publication No. WO00/09518.

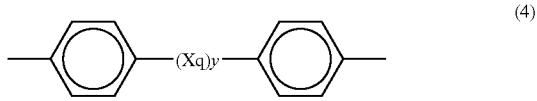
(4)

(wherein Xq represents —C(CH$_3$)$_2$—, —SO$_2$—, —S—, or —O—, and y represents 0 or 1.)

Specifically, these phosphazene compounds having a crosslinked structure are produced by reacting an alkali metal salt of a phenol and an alkali metal salt of an aromatic dihydroxy compound with a dichlorophosphazene oligomer. These alkali metal salts are added to the dichlorophosphazene oligomer in an amount that is slightly more than the theoretical amount.

These compounds may be used alone or as a mixture of two or more of them.

A contributing factor to flame retardancy is the concentration of phosphorus atoms contained in molecules. In phosphazene compounds, chain phosphazene having a chain structure has a lower phosphorus content than cyclic phosphazene compounds because of the presence of a substituent group at a molecular end. For this reason, if the same weight is added, it seems that cyclic phosphazene compounds can provide a higher flame retardancy than chain phosphazene compounds. In the present invention, therefore, phosphazene compounds having a cyclic structure are preferably used and flame retardants containing having 95 mass % or more of cyclic phosphazene compounds are preferable.

In addition, a phosphazene compound is a mixture of compounds having different structures including ring compounds such as a cyclic trimer and a cyclic tetramer and chain phosphazene. If a phosphazene compound is added to a resin, a higher content of a cyclic trimer and a cyclic tetramer tends to provide a more preferable processability to the resin. Specifically, a phosphazene compound preferably contains 80 mass % or more of cyclic trimer and/or tetramer compounds, more preferably 85 mass % or more of trimer and/or tetramer compounds, and much more preferably 93 mass % or more of trimer and/or tetramer compounds.

In addition, in the present invention, if a phosphazene compound containing preferably 70 mass % or more of a trimer, more preferably 76 mass % or more of a trimer, much more preferably 80 mass % or more of a trimer, or still more preferably 85 mass % or more of a trimer is used, the phosphazene compound provides especially good flame retardancy and further improves good mechanical characteristics.

In addition, a phosphazene compound can take various forms such as liquid form, wax form, and solid form, depending on the differences in the type and structure of the substituent group, and any form is possible unless it impairs the advantages of the present invention. In solid form, the bulk density is preferably 0.45 g/cm$^3$ or more, and more preferably 0.45 g/cm$^3$ or more and 0.75 g/cm$^3$ or less.

The content of each of the alkali metal components such as sodium and potassium contained in the hosphazene compound is preferably 200 ppm or less, more preferably 50 ppm or less, and much more preferably, the content of all alkali metal components is 50 ppm or less.

In addition, in the phosphazene compound, a phosphazene compound where at least one of the substituent groups X in the general formula (1) is a hydroxy group, in other words, the content of a phosphazene compound containing a P—OH bond is preferably less than 1 mass %, and the chlorine content is preferably 1000 ppm or less, more preferably 500 ppm or less, and much more preferably 300 ppm or less.

The phosphazene compound where at least one of the substituent groups X is a hydroxy group may contain an oxo-form structure represented by the following general formula (5). However, the content of a phosphazene compound having this oxo-form structure is preferably less than 1 mass %. The same holds true for phosphazene compounds having a chain structure represented by the above general formula (2).

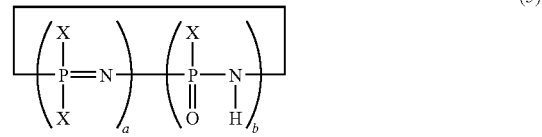
(5)

(wherein each of a and b is an integer and its sum (a+b) is an integer of 3 or more. In addition, X in the formula may be the same or different.)

Known phosphate esters can be used. Examples of thereof may include triphenyl phosphate, triphenyl phosphate, tricresyl phosphate, tryxylenyl phosphate, cresyl diphenyl phosphate, xylenyl diphenyl phosphate, dixylenyl phenyl phosphate, cresyl dixylenyl phosphate, and dicresyl xylenyl phosphate.

Examples of condensed phosphate esters may include pentaerythritol diphosphate and phosphate ester-based compounds having the following general formula (6) or (7). A condensed phosphate ester synthesized with bisphenol A and phenol as raw materials and a condensed phosphate ester obtained with bisphenol A or resorcin and 2,6-xylenol as raw materials are more preferable.

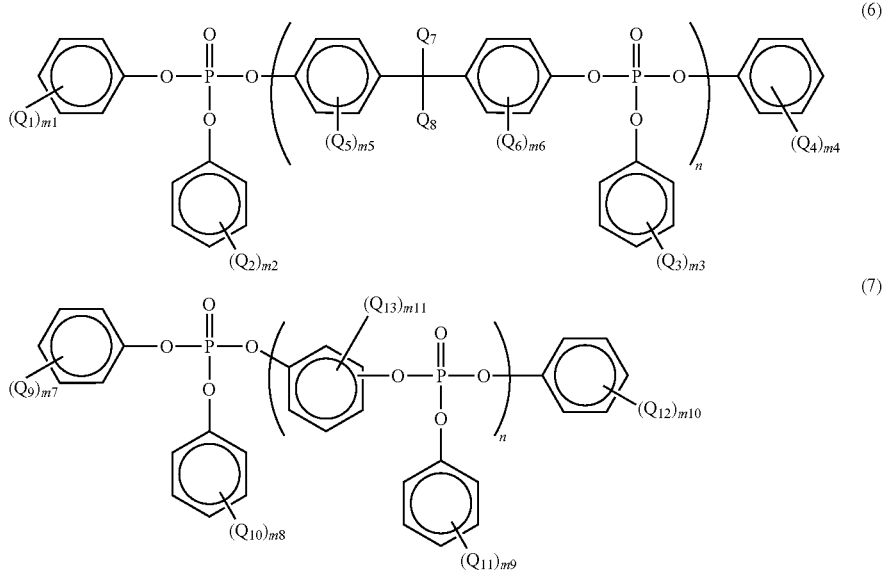

(wherein $Q_1$, $Q_2$, $Q_3$, $Q_4$, $Q_9$, $Q_{10}$, $Q_{11}$, and $Q_{12}$ independently represent a hydrogen atom or an alkyl group having a carbon number of 1 to 6 and $Q_5$, $Q_6$, $Q_7$, $Q_8$, and independently represent a hydrogen atom or a methyl group. m1, m2, m3, m4, m7, m8, m9, and m10 independently represent an integer of 0 to 3, m5 and m6 independently represent an integer of 0 to 2, and m11 independently represents an integer of 0 to 4.)

Examples of phosphinate may include at least one selected from phosphinates represented by the following general formula (8) and/or (9) and/or these polymers.

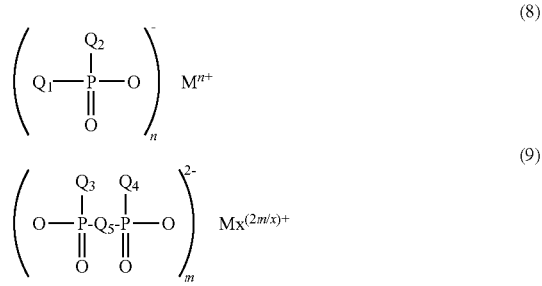

(wherein $Q_1$, $Q_2$, $Q_3$, and $Q_4$ independently represent a group selected from a hydrogen atom, and an alkyl group having a carbon number of 1 to 12, an alkoxy group, an aryl group, and an aryloxy group having a carbon number of 1 to 12, $Q_5$ represents a group selected from alkylene, arylalkylene, arylene, alkylarylene, and diarylene having a carbon number of 1 to 18. Each of n and m is an integer of 1 to 3 and x is 1 or 2. In addition, M represents a metal atom in the fourth and subsequent rows of the periodic table or a group selected from amide, an ammonium group and a melamine derivative, and if x is 2, the group may be the same or different.)

Known tertiary phosphines can be preferably used. Examples of thereof may include triarylphosphine, trialkylphosphine, triaryloxyphosphine, trialkoxyphosphine, bis(diarylphosphino)benzene, and tris(diarylphosphino)benzene. The temperature at which a decrease in mass is 10 mass % when such a tertiary phosphine is heated in an inert gas atmosphere at a rate of temperature rise of 10° C./min from room temperature to 600° C., as determined according to TGA, is preferably 150° C. to 320° C. in view of a balance between heat resistance as well as flame retardancy and mechanical characteristics. Specifically, triarylphosphine, trialkylphosphine, triaryloxyphosphine, and trialkoxyphosphine are preferable and triarylphosphines represented by the following general formula (10) are more preferable.

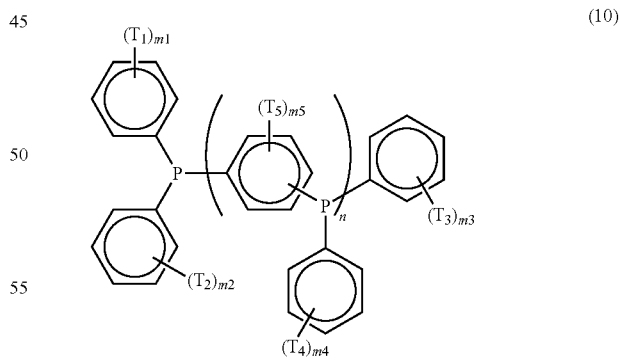

(wherein $T_1$, $T_2$, $T_3$, and $T_4$ independently represent a hydrogen atom or an alkyl or aryl group having a carbon number of 1 to 12, and $T_5$ represents a hydrogen atom or a methyl group. m1, m2, m3, and m4 independently represent an integer of 0 to 5, and m5 independently represents an integer of 0 to 4. In addition, n in the formula represents an integer of 0 to 3. In addition, a naphthyl group can be preferably used as an aryl group. Moreover, the three aryl groups on a phosphorus atom may be all the same or different from one another.)

In the present invention, an antimony-based compound can be used with a flame retardant. Examples of the antimony-based compound may include antimony oxides such as antimony trioxide, antimony tetroxide, and antimony pentoxide; and sodium antimonate.

Furthermore, if thermal conductivity is to be improved, a filler (6) can be added. The filler (6) refers to a filler having a thermal conductivity of from 10 to 400 W/m·K and excludes the zinc oxide (3). Examples of the filler (6) may include metal powders, metal nitrides, metal carbides, metal oxides, and carbon compounds. More specifically, Metal powders: gold, silver, copper, aluminum, copper-aluminum alloy, copper-tin alloy, aluminum-tin alloy, and the like;
Metal nitrides: silicon nitride, aluminum nitride, boron nitride, and the like;
Metal carbides: silicon carbide, aluminum carbide, boron carbide, and the like;
Metal oxides: zinc oxide, magnesium oxide, aluminum oxide, silicon dioxide, and the like; and
Carbon compounds: graphite, black lead, Ketjen black, carbon fiber, CNT, and the like.

Among the filler examples, silicon nitride, aluminum nitride, silicon carbide, boron nitride, and graphite are preferable in view of thermal conductivity, electrical insulation control, and compounding handling, safety, and the like; and graphite, aluminum nitride, or boron nitride is more preferable in view of thermal conductivity. Aluminum nitride or boron nitride is more preferable in view of thermal conductivity and electrical insulation.

If graphite is used, various natural graphites or artificial graphites can be used. As natural graphites, flake graphite, massive graphite, and earthy graphite can be used. Expanded graphite produced by inserting (intercalating) sulfuric acid or the like between layers of flake graphite or the like, heating at a temperature of from 800 to 1000° C., and expanding the intralayer distance greatly can also be used. The shape of graphite used is preferably spherical in view of toughness. In addition, the average particle size of the filler (6) that can be used in the present invention is preferably 0.5 μm or more and 100 μm or less, and more preferably 0.5 μm or more and 50 μm or less. Much more preferably, if the filler (6) is aluminum nitride, its average particle size is 0.5 μm or more and 2 μm or less and if the filler (6) is boron nitride, its average particle size is 0.8 μm or more and 30 μm or less. If the filler (6) is graphite, its average particle size is 25 μm or more and 50 μm or less for higher thermal conductivity and 1 μm or more and less than 25 μm for higher toughness.

In addition, the ratio T2/T1 of the thickness T1 (μm) of a thermally conductive sheet molded from a thermally conductive material according to the present invention to the average particle size T2 (μm) of the zinc oxide (3) or the filler (6), whichever is greater, is preferably 1 or less, more preferably 0.8 or less, and much more preferably 0.5 or less. If T2/T1 is 1 or less, particles of the zinc oxide (3) or the filler (6) do not protrude from the surface of the sheet, keeping the sheet surface smooth. For this reason, even if the thermally conductive sheet is used in applications requiring electrical insulation such as electronic substrates, it causes no problems such as the passage of current.

The purity of the filler (6) is preferably 90% or more, more preferably 97% or more, and much more preferably 99% or more, in view of thermal conductivity and ease of control of electrical insulation.

In the thermally conductive material according to the present invention, for the content of the hydrogenated copolymer (1) and the modified hydrogenated copolymer (2), if a thermally conductive material having excellent adhesion is to be obtained, it is recommended that the content of the modified hydrogenated copolymer (2) based on the total content of the hydrogenated copolymer (1) and the modified hydrogenated copolymer (2) be preferably 50 mass % or more, more preferably 70 mass % or more, and much more preferably 90 mass % or more. In addition, if a thermally conductive material having excellent corrosion resistance is to be obtained, it is recommended that the content of the modified hydrogenated copolymer (2) be preferably 30 mass % or less, more preferably 20 mass % or less, and much more preferably 10 mass % or less.

In the thermally conductive material according to the present invention, if it does not contain the paraffin oil (4), the total content of the hydrogenated copolymer (1) and the modified hydrogenated copolymer (2), [(1)+(2)], is 10 mass % or more and 90 mass % or less based on 100 mass % of the thermally conductive material. A total content [(1)+(2)] of 10 mass % or more provides sufficient flexibility and toughness while 90 mass % or less provides sufficient thermal conductivity.

The content of the zinc oxide (3) is 10 mass % or more and 90 mass % or less, preferably 50 mass % or more and 90 mass % or less, more preferably 65 mass % or more and 90 mass % or less, and much more preferably 70 mass % or more and 90 mass % or less based on 100 mass % of the thermally conductive material. However, if the flame retardant (5) is contained, the content of the zinc oxide (3) is 10 mass % or more and 87 mass % or less, preferably 50 mass % or more and 87 mass % or less, more preferably 65 mass % or more and 87 mass % or less, and much more preferably 70 mass % or more and 87 mass % or less based on 100 mass % of the thermally conductive material. Such a range provides excellent heat dissipation, flexibility, and toughness.

The total content of the hydrogenated copolymer (1), the modified hydrogenated copolymer (2), and the paraffin oil (4), [(1)+(2)+(4)], is 10 mass % or more and 90 mass % or less based on 100 mass % of the thermally conductive material. However, if the flame retardant (5) is contained, the total content [(1)+(2)+(4)] is 10 mass % or more and 87 mass % or less based on 100 mass % of the thermally conductive material. In either case, the range provides good flexibility and toughness as well as good thermal conductivity. The total content [(1)+(2)+(4)] is more preferably 10 mass % or more and 60 mass % or less, and much more preferably 10 mass % or more and 40 mass % or less.

In addition, the ratio of the mass of the paraffin oil (4) to the total mass of the hydrogenated copolymer (1) and modified hydrogenated copolymer (2) used in the present invention, [(4)/{(1)+(2)}], is greater than 0 and 2 or less, preferably 0.5 or more and 1.5 or less, and more preferably 0.8 or more and 1.2 or less. A mass ratio of 2 or less can prevent the bleed-out of the paraffin oil (4). The use of the paraffin oil (4) can provide higher flexibility and allow the zinc oxide (3) to be mixed in larger amounts, thereby providing higher thermal conductivity.

In addition to satisfying the above content and ratio, the content of the paraffin oil (4) is preferably 0 mass % or more and 90 mass % or less based on 100 mass % of the thermally conductive material. The content is more preferably 0 mass % or more and 50 mass % or less, and much more preferably 0 mass % or more and 20 mass % or less.

The content of the flame retardant (5) used in the present invention is 3 mass % or more and 30 mass % or less based on 100 mass % of the thermally conductive material. The content is preferably 3 mass % or more and 20 mass % or less, and more preferably 3 mass % or more and 15 mass % or less. A content of 30 mass % or less can provide sufficient thermal conductivity, whereas a content of 3 mass % or more can provide flame retardancy.

The ratio of the mass of the flame retardant (5) to the total mass of hydrogenated copolymer (1), the modified hydrogenated copolymer (2), and the paraffin oil (4), [(5)/{(1)+(2)+(4)}], is preferably 0.2 or more and 3 or less, more preferably 0.4 or more and 3 or less, much more preferably 0.6 or more and 2.5 or less, and most preferably 1 or more and 2 or less. A mass ratio of 0.2 or more can provide flame retardancy, whereas a mass ratio of 3 or less can provide sufficient flexibility and toughness.

If the flame retardant (5) is not contained, the total content of the zinc oxide (3) and the filler (6), [(3)+(6)], is preferably 10 mass % or more and 90 mass % or less based on 100 mass % of the thermally conductive material. The total content is more preferably 50 mass % or more and 90 mass % or less, much more preferably 65 mass % or more and 90 mass % or less, and most preferably 70 mass % or more and 90 mass % or less.

If the flame retardant (5) is contained, the total content [(3)+(6)] is preferably 10 mass % or more and 87 mass % or less based on 100 mass % of the thermally conductive material. The content is more preferably 50 mass % or more and 87 mass % or less, much more preferably 65 mass % or more and 87 mass % or less, and most preferably 70 mass % or more and 87 mass % or less. Such a range provides excellent heat dissipation, flexibility, and toughness.

The ratio of the mass of the filler (6) to the total mass [(3)+(6)] of the zinc oxide (3) and the filler (6) is preferably greater than 0 and less than 0.5, more preferably 0.1 or more and 0.3 or less, and much more preferably 0.1 or more and 0.15 or less. If the ratio of the mass of the filler (6) to the total mass [(3)+(6)] is 0.5 or less, thermal conductivity increases because of the contact of the filler (6) with the zinc oxide (3) and the like.

Here, the effects of the filler (6) on thermal conductivity and electrical insulation vary because conditions such as how the filler (6) comes into contact with the zinc oxide (3) vary depending on the type, shape, particle size, and particle size distribution of the filler (6) used. To satisfy electrical insulation that a thermally conductive material and a thermally conductive sheet molded therefrom are required to have in electric and electronic applications, the content of the filler (6) is selected from a range of the ratio of the mass of the filler (6) to the total mass [(3)+(6)] of the zinc oxide (3) and the filler (6) between 0 or more and less than 0.5 so that volume resistivity at an applied voltage of 100 V is $1\times10^8$ Ω·cm or more and less than $1\times10^{16}$ Ω·cm.

In addition to satisfying the content and ratio above, the content of the filler (6) is 0 mass % or more and less than 45 mass % based on 100 mass % of the thermally conductive material. The content is more preferably 3 mass % or more and less than 45 mass %, and much more preferably 8 mass % or more and less than 45 mass %.

The thermally conductive material according to the present invention may contain additives such as a polymer made only from a vinyl aromatic, an acrylic-based resin, a fatty acid, a fatty acid salt, an anti-drip agent as a flame retardant aid, an antioxidant, an ultraviolet absorber, a rigidity improver, a thermal stabilizer, an antistatic agent, a light stabilizer, an antiaging agent, and a colorant as needed unless the material impairs the object of the present invention.

The acrylic-based resin refers specifically to a polymer or copolymer of at least one compound selected from the group consisting of (meth)acrylic acid alkyl ester. Examples of the (meth)acrylic acid alkyl ester may include methyl acrylate, methyl methacrylate, ethyl acrylate, ethyl methacrylate, n-propyl acrylate, n-butyl acrylate, 2-ethyl hexyl acrylate, and hexyl methacrylate, 2-ethyl hexyl methacrylate, and dodecyl methacrylate. As an acrylic-based resin, each of these compounds can be used alone or if it is a copolymer obtained by polymerizing a combination of two or more of them. In addition, a graft copolymer obtained by grafting poly(alkyl)methacrylate on acrylic-based rubber particle obtained by polymerizing acrylic acid alkyl ester can also be used. Examples of the copolymer may include Hiblen (trade name) from Zeon KASEI Co., Ltd.

The content of an acrylic-based resin is greater than 0 and 5 mass % or less, more preferably 0.01 mass % or more and 5 mass % or less, and much more preferably 0.05 mass % or more and 2 mass % or less, based on 100 mass % of the thermally conductive material. The addition of an acrylic-based resin can reduce the anisotropy in the direction of heat conduction and greatly reduce variation in the thickness of sheets formed by calendering or the like. However, if the content of the acrylic-based resin exceeds 5 mass %, thermal conductivity decreases.

The fatty acid and fatty acid salt may be a saturated fatty acid and a saturated fatty acid salt or an unsaturated fatty acid and an unsaturated fatty acid salt. A carbon number of 8 to 34 is more preferable and a carbon number of 14 to 22 is much more preferable. In addition, a saturated fatty acid and a saturated fatty acid salt are preferable. Examples thereof may include fatty acids such as lauric acid, tridecylic acid, myristic acid, pentadecylic acid, palmitic acid, heptadecylic acid, stearic acid, nonadecanoic acid, oleic acid, capric acid, behenic acid, linoleic acid, and montanoic acid and alkaline earth metal salts of these acids such as magnesium salt, calcium salt, and barium salt as well as zinc metal salts of the acids. Among these, stearic acid, oleic acid, and lauric acid, alkaline earth metal salts of these acids (magnesium salt and calcium salt), and zinc metal salts of the acids are preferably used.

The total content of the fatty acid and the fatty acid salt is preferably greater than 0 and 5 mass % or less, 0.2 mass % or more and 3 mass % or less, and much more preferably 0.5 mass % or more and 2 mass % or less, based on 100 mass % of the thermally conductive material. The addition of a fatty acid and a fatty acid salt greatly increases the properties of releasing a sheet from the rollers at high temperature in T-die sheet forming and calendering. These good sheet release properties provide a thermally conductive sheet having excellent smoothness, and when the resulting thermally conductive sheet is placed on an electronic substrate, this smoothness increases adhesion and thus greatly improves thermal conductivity. The addition also greatly reduces variation in the thickness of a thermally conductive sheet formed by calendering or the like. If the content of a fatty acid and a fatty acid salt is 5 mass % or less, sufficient thermal conductivity is also retained.

As a flame retardant aid, an anti-drip agent such as polytetrafluoroethylene can also be added. The molecular weight of this polytetrafluoroethylene is $10\times10^4$ or more, preferably about $20\times10^4$ to $300\times10^4$. A molecular weight of $10\times10^4$ or more inhibits a thermally conductive material containing polytetrafluoroethylene from dripping at burning. Examples of the polytetrafluoroethylene may include Metablen (registered trademark) from Mitsubishi Rayon Co., Ltd.

Examples of the antioxidant that can be used in the present invention may include hindered phenol-based antioxidants, amine-based and hydroxylamine-based antioxidants. Examples of the hindered phenol-based antioxidants may include triethylene glycol-bis[3-(3-t-butyl-5-methyl-4-hydroxyphenyl)-propionate], and pentaerythrityl-tetrakis[3-(3, 5-di-t-butyl-4-hydroxyphenyl)propionate].

Examples of the ultraviolet absorber that can be used in the present invention may include benzotriazole-based ultraviolet absorbers, benzophenone-based ultraviolet absorbers, salicylate-based ultraviolet absorbers, cyanoacrylate-based ultraviolet absorbers, and nickel complex salt ultraviolet absorbers. Benzotriazole-based ultraviolet absorbers and benzophenone-based ultraviolet absorbers are particularly preferable.

To increase the mechanical strength of the thermally conductive material according to the present invention, rigidity improvers such as calcium carbonate and magnesium carbonate can be used.

For the electrical insulation of the thermally conductive material according to the present invention and a thermally conductive sheet molded therefrom, if the volume resistivity at an applied voltage of 100 V is $1\times10^8$ Ω·cm or more and less than $1\times10^{16}$ Ω·cm, built-up static electricity or the passage of current does not break electronic parts or the like. The volume resistivity is preferably $1\times10^{10}$ Ω·cm or more and less than $1\times10^{16}$ Ω·cm, and more preferably $1\times10^{12}$ Ω·cm or more and less than $1\times10^{16}$ Ω·cm. In addition, the applied voltage at which the volume resistivity is $1\times10^8$ Ω·cm or more and less than $1\times10^{16}$ Ω·cm is preferably 100 V or more, more preferably 250 V or more, much more preferably 500 V or more, and most preferably 1 kV or more.

The thermally conductive material according to the present invention can easily be produced by a traditional known technique such as a Brabender, a kneader, a Banbury mixer, or a twin or single screw extruder.

The thermally conductive material according to the present invention has excellent thermal conductivity and is thermoplastic, so it can be melted and injected into a mold into the desired shape. For this reason, the thermally conductive material according to the present invention is preferably used as molded bodies in various heat dissipation applications.

Molded bodies having such characteristics are obtained by heating, melting, plasticating, and molding the thermally conductive material according to the present invention into the desired shape. Specifically, they can be produced by known molding processes such as injection molding, injection press molding, or gas injection molding.

Among them, molded bodies in sheet form are preferable because the thermally conductive material according to the present invention is thermoplastic, melt which has been heated and plasticated can easily be shaped into a continuous thin-walled sheet, there are little amounts of volatile components due to heating, and the like.

After keading by the above technique, a thermally conductive sheet molded from the thermally conductive material according to the present invention can be produced by a process such as T-die sheet forming, calendering, blow molding, press molding, or blown film extrusion as a fabrication process other than injection molding, injection press molding, and gas injection molding. Among the processes, T-die sheet forming or blown film extrusion is preferable to produce a thermally conductive sheet formed from a thermally conductive material having a thickness of 0.2 mm or less. To produce a thermally conductive sheet having excellent surface smoothness, calendering or press molding is preferable. When a thermally conductive sheet having excellent surface smoothness is placed on a heating body, the material adheres closely to the heating body and a cooling part and thus brings both close to each other, providing excellent heat dissipation.

Specifically, for the smoothness of the thermally conductive sheet, the 60° surface gloss on the surface of the thermally conductive sheet molded from the thermally conductive material as determined according to JIS K7105 is preferably 10 or more.

The thickness of the thermally conductive sheet molded from the thermally conductive material according to the present invention is preferably 30 μm or more and 3 cm or less. A thickness of 30 μm or more allows the electrical insulation to be retained, whereas a thickness of 3 cm or less provides easy fabrication and handling. In addition, a thicker thermally conductive sheet provides higher electrical insulation and flame retardancy.

In applications where heat from a heating body is required to dissipate rapidly, a thin sheet having a short path to conduct heat is preferable. Specifically, the thickness of the sheet is more preferably 30 μm or more and 1 mm or less, and much more preferably 30 μm or more and 0.5 mm or less. In addition, in applications as a spacer between a heating body such as a CPU and a cooling part such as a heatsink, a cushioned thick sheet is preferable. Specifically, the thickness of the sheet is preferably greater than 1 mm and 3 cm or less and the JIS A hardness of the sheet is preferably 65 or less, and more preferably 45 or less. This cushioned thick thermally conductive sheet is preferable as a spacer (installed between the floor and circulation pipes) for house floor heating.

The JIS A hardness of the thermally conductive sheet molded from the thermally conductive material according to the present invention is preferably 20 more and 95 or less. A hardness of 95 or less brings a semiconductor element and a cooling part sufficiently close to each other, providing good thermal conductivity. A hardness of 20 or more provides easy handling.

The thermally conductive material according to the present invention and the thermally conductive sheet molded from the thermally conductive material can be recycled in view of the prevention of environmental problems such as waste. Specifically, they can be recycled in the following ways:

1) The thermally conductive sheets collected after they have once been distributed to the market or the like are shredded as needed and the thermally conductive material is added to the shredded sheets, which are then melted and formed again into a sheet; or
2) Collected thermally conductive sheets are melted and kneaded again along with thermally conductive material pellets or the raw materials of the present invention and formed into a sheet to produce a thermally conductive sheet.

The content of the collected thermally conductive sheets is preferably 100 mass % or less, more preferably 50 mass % or less, and much more preferably 30 mass % or less based on 100 mass % of the collected thermally conductive sheets plus the thermally conductive material or the raw materials of the present invention. Such a range allows for the recycling of the thermally conductive material and the thermally conductive sheet molded from the thermally conductive material while maintaining the characteristics of the thermally conductive material and the thermally conductive sheet molded therefrom.

The thermally conductive material according to the present invention and the thermally conductive sheet molded therefrom are preferably used in applications that require high thermal conductivity, electrical insulation, flexibility, toughness, and flame retardancy, such as Thermally conductive parts for computers: personal computers, video game machines and the like, and cell phones and the like;

Thermally conductive parts for display power supply units and the like: home televisions, plasma displays, liquid crystal televisions, and the like;

Thermally conductive parts for AV equipment, OA equipment, and the like: DVD players, DVD recorders, HDD recorders, home televisions, plasma displays, liquid crystal televisions, and the like;

Thermally conductive parts for light sources for LED backlight: liquid crystal TVs and the like;

Thermally conductive parts for automobile electric/electronic members: car stereos, car navigation systems, and the like; and Other thermally conductive parts: inverters, lights, air conditioners, and the like.

The content of the vinyl aromatic unit and the content of the polymer block comprising a vinyl aromatic were determined with unhydrogenated copolymers because their values before and after hydrogenation remained unchanged under the hydrogenation conditions of the present invention.

Here, to determine the content of each raw material and the composition from the states of the thermally conductive material and the thermally conductive sheet, the thermally conductive material or the thermally conductive sheet is dissolved in chloroform, cyclohexane, a cyclohexane-chloroform solvent mixture mixed at an appropriate ratio or the like and the resulting solution is used for the determination.

In addition, when the vinyl aromatic polymer block content is calculated from a hydrogenated copolymer, a nuclear magnetic resonance (NMR) apparatus (JMN-270WB, JEOL Ltd.) is used and the method described in Y. Tanaka, et al., Rubber Chemistry and Technology 54, 685(1981) is followed. Specifically, 30 mg of a hydrogenated copolymer is dissolved in 1 g of deuterated chloroform to prepare a sample and measure the $^1$H-NMR spectrum of the sample. If the vinyl aromatic is styrene, the apparent vinyl aromatic polymer block content (Ns) obtained by NMR measurement and the vinyl aromatic polymer block content (Os) are calculated with the following numbers and the following formulas.

Block styrene strength $(S1)$=(value integrated from 6.9 to 6.3 ppm)/$2$

Random styrene strength $(S2)$=(value integrated from 7.5 to 6.9 ppm)−3×$(S1)$

Ethylene-butylene strength $(EB)$=Total integrated value−3×[$(S1)$+$(S2)$]/8

Apparent vinyl aromatic polymer block content $(Ns)$= 104×$(S1)$/[104×{$(S1)$+$(S2)$}+56×$(EB)$]

$Os = -0.012 \times (NS)^2 + 1.8 \times (Ns) - 13.0$

EXAMPLES

The present invention will be specifically described below with Examples, and the present invention is not limited only to the Examples.

[Raw Materials]
<Hydrogenated Copolymer (1)>
(Polymer 1)
This was produced by the following polymerization process.
Reaction Conditions and the Like
Reactor: A stirrer having an internal volume of 10 L and a jacketed tank reactor Reaction temperature: Kept at 70° C. during polymerization. Kept at 65° C. during hydrogenation reaction.

Hydrogenation catalyst: 1 L of dried and purified cyclohexane was placed in a reaction vessel for nitrogen-substituted hydrogenation catalyst preparation, to which 100 mmol of bis(η5-cyclopentadienyl)titanium dichloride was then added. An n-hexane solution containing 200 mmol of trimethylaluminum was further added under vigorous stirring and reaction was allowed to take place at room temperature for about 3 days to prepare the desired catalyst.

Reaction Procedure (i) 10 mass parts of cyclohexane was placed in the reactor and adjusted to a temperature of 70° C.

(ii) As the first-stage reaction, 0.076 mass parts of n-butyllithium and 0.4 mol of N,N,N',N'-tetramethylethylenediamine (hereinafter referred to as TMEDA) based on 1 mol of n-butyllithium were added.

(iii) A cyclohexane solution (monomer concentration, 22 mass %) containing 8 mass parts of styrene was added over about 3 minutes and after completion of addition, reaction was allowed to take place for 30 minutes.

(iv) As the second-stage reaction, a cyclohexane solution (monomer concentration, 22 mass %) containing 48 mass parts of 1,3-butadiene and 36 mass parts of styrene was continuously fed to the reactor over 60 minutes at a constant rate and after completion of addition, reaction was allowed to take place for 30 minutes.

(v) As the third-stage reaction, a cyclohexane solution (monomer concentration, 22 mass %) containing 8 mass parts of styrene was added over about 3 minutes and after completion of addition, reaction was allowed to take place for 30 minutes to obtain a copolymer.

(vi) 100 mass ppm of the hydrogenation catalyst in terms of the amount of titanium was added to the copolymer obtained, and hydrogenation reaction was allowed to take place at a hydrogen pressure of 0.7 MPa and a temperature of 65° C.

(vii) After completion of reduction, methanol was added and then 0.3 mass % of octadecyl-3-(3,5-di-t-butyl-4-hydroxyphenyl)propionate was added as a stabilizer based 100 mass % of the copolymer to obtain a hydrogenated copolymer.

The hydrogenated copolymer obtained had a weight-average molecular weight of $16.5 \times 10^4$, a molecular weight distribution of 1.2, and a degree of hydrogenation of 99%. In addition, dynamic viscoelasticity measurement showed that the peak temperature of tan δ was at −15° C. Moreover, DSC measurement showed no crystallization peak.

In addition, the content of the vinyl aromatic unit calculated from the unhydrogenated copolymer obtained after the third-stage reaction was 52 mass %, the content of the polymer block comprising a vinyl aromatic was 16 mass %, and the vinyl bond content of the 1,3-butadiene part was 21 mass %.

(Polymer 2)
This was produced by the following polymerization process.

An unhydrogenated copolymer was obtained in the same way as polymer 1 except for the use of 4.5 mass parts of styrene at the first stage, 49 mass parts of 1,3-butadiene and 42 mass parts of styrene at the second stage, and 4.5 mass part of styrene at the third stage. Next, hydrogenation reaction was allowed to take place as with polymer 1 to obtain a hydrogenated copolymer. The hydrogenated copolymer obtained has a weight-average molecular weight of $17.5 \times 10^4$, a molecular weight distribution of 1.2, and a degree of hydrogenation of 99%. In addition, dynamic viscoelasticity measurement showed that the peak temperature of tan δ was at −14° C. Moreover, DSC measurement showed no crystallization peak.

In addition, the content of the vinyl aromatic unit calculated from the unhydrogenated copolymer obtained after the third-stage reaction was 51 mass %, the content of the polymer block comprising a vinyl aromatic was 9 mass %, the vinyl bond content of the butadiene part was 21 mass %.
<Modified Hydrogenated Copolymer (2)>
(Polymer 3)

This was produced by the following polymerization process.

A modified copolymer was obtained in the same way as polymer 1 except that as the third-stage reaction in producing polymer 1, the same mole of styrene and the modifier tetraglycidyl-1,3-bisaminomethylcyclohexane as the mole of n-butyllithium was added to the living polymer solution obtained at the second-stage reaction and reaction was allowed to take place. The modified copolymer obtained had a weight-average molecular weight of $16.5 \times 10^4$, a molecular weight distribution of 1.2, a degree of hydrogenation of 99%, and a degree of modification of 80%. In addition, dynamic viscoelasticity measurement showed that the peak temperature of tans was at −15° C. Moreover, DSC measurement showed no crystallization peak.

In addition, the content of the vinyl aromatic unit calculated from the unhydrogenated modified copolymer obtained after the third-stage reaction was 52 mass %, the content of the polymer block comprising a vinyl aromatic was 16 mass %, and the vinyl bond content of the butadiene part was 21 mass %.
<Other Thermoplastic Resins>
(Polymer 4)

Tuftec (registered trademark) H1043 (styrene/ethylene-butylene=67/33), a hydrogenated styrene thermoplastic elastomer (SEBS), from Asahi Kasei Chemicals Corporation
(Polymer 5)

SunAllomer (trade name) PM900A, a polypropylene resin, from SunAllomer Ltd.
<Zinc Oxide (3)>
[Zinc Oxide A]

Pana-Tetra (registered trademark) WZ-0501, having a core part and acicular crystal parts extending from the core part in four different axial directions, (no surface treatment; the diameter of the base of the acicular crystal parts, 0.7 to 14 μm; the length from the base of the acicular crystal parts and an end, 3 to 200 μm), from AMTEC Co., Ltd.
[Zinc Oxide B]

Ginrei (registered trademark) A, having a spherical structure (average particle size, 0.2 μm), from Toho Zinc Co., Ltd.
<Paraffin Oil (4)>

Diana (registered trademark) Process Oil PW380] (kinematic viscosity at 40° C., 382 mm$^2$/s) from Idemitsu Kosan Co., Ltd.
<Flame Retardant (5)>
[Flame Retardant A]

Firecut (trade name) P-680 (bis(dibromopropyl)tetrabromobisphenol A (DBP-TBBA)), a halogen-based flame retardant, from Suzuhiro Chemical Co., Ltd.
[Flame Retardant B]

Pyroguard (registered trademark) AN-800(T) (antimony trioxide) from Dai-ichi Kogyo Seiyaku Co., Ltd.
[Flame Retardant C]

SPS-100 (trade name) (phenoxyphosphazene; n=3, 90 mass % or more), a phosphorus-based flame retardant, from Otsuka Chemical Co., Ltd.

[Flame Retardant D]

Pyrolyzer (registered trademark) HG, a nonhalogen, nonphosphorus flame retardant, (aluminum hydroxide surface-treated with ammonium nitrate; average particle size, 1.1 μm), from Ishizuka Glass Co., Ltd.
[Flame Retardant E]

Metablen (registered trademark) A-3800J, a polytetrafluoroethylene, from Mitsubishi Rayon Co., Ltd.
<Filler (6)>
[Filler A]

SHOBN (registered trademark) UHP-1, a boron nitride, (average particle size, 10 μm; thermal conductivity, about 130 W/m·K), from Showa Denko K.K.
[Filler B]

SN-EO3 (trade name), a high-purity silicon nitride powder, (average particle size, 1.0 μm; thermal conductivity, about 80 W/m·K), from Ube Industries, Ltd.
[Filler C]

Shapal E-Grade (registered trademark), a high-purity aluminum nitride powder, (average particle size, 1.1 μm; thermal conductivity, about 200 W/m·K), from Tokuyama Corporation.
[Filler D]

Spherical graphite SG-BL40 (trade name), having a spherical structure, (average particle size, 40 μm), from Ito Kokuen Co., Ltd.
[Filler E]

SYZR3252 (trade name), an expanded graphite, (average particle size, 45 μm), from Sanyo Trading Co., Ltd. Expanded graphite has a flame-retardant effect.
<Additives>
[Additive A]

Adeka (registered trademark) Fatty Acid SA-200 (stearic acid) from Adeka Corporation.
[Additive B]

Hiblen (trade name) B403, an acrylic resin, from Zeon KASEI Co., Ltd.
[Processes for Fabricating Samples]

The fabricated samples evaluated in Examples 1 to 22 and Comparative Examples 1 to 9 were fabricated by using the following processes.
(Press-Molded Sheet)

A thermally conductive material pellet was kneaded with a 3-inch roll kneader at 200° C. and formed into a sheet. This sheet was then subjected to press molding involving heating at 200° C. to obtain a 120 mm long×220 mm wide, 1 mm-thick press-molded sheet. Similarly, 2 mm-thick and 5 mm-thick press-molded sheets were also prepared.
(0.3 mm-Thick Formed T-Die Sheet)

A single-screw extruder set at 190° C. (Toyo Seiki Seisaku-sho, Ltd.; Labo Plastomill model, SOM; Screw model, D2020) and a 120 mm-wide T-die (Toyo Seiki Seisaku-sho, Ltd.) with the thickness of the T-die lip adjusted to 0.3 mm was used to obtain an about 100 mm-wide, 0.3 mm-thick formed T-die sheet from a thermally conductive material pellet.

The fabricated samples evaluated in Examples 19 and 20 were fabricated by using the following processes.
(Calendering)

Raw materials having the composition of Example 2 were melted and kneaded for 5 minutes with a pressure kneader set at a volume of 75 L, a temperature of 170° C., and a blade rotational speed of 20 rpm to obtain a mass of a thermally conductive material. The mass of a thermally conductive material was formed into a 200 mm-wide, 10 mm-thick sheet by using a counter-rotating twin-screw extruder with a die installed at the tip of the extruder at a cylinder temperature of 150° C. The sheet was calendered by using a roll calendering machine with the calender roll diameter adjusted to 1000 mm, the width to 1600 mm, the temperature to 140° C., and the roll gap to 1 mm to obtain an about 1000 mm-wide, 1 mm-thick sheet.

(T-Die Sheet Forming)

The thermally conductive material pellet obtained in Example 2 was formed into a 1 mm-thick sheet by using a single-screw extruder set at 190° C. (Toyo Seiki Seisaku-sho, Ltd.; Labo Plastomill model, 50M; Screw model, D2020) and a 120 mm-wide T-die (Toyo Seiki Seisaku-sho, Ltd.) with the thickness of the T-die lip adjusted to 1 mm and the take-off speed adjusted (Toyo Seiki Seisaku-sho, Ltd.; conveyor-type take-off system, Conveyor CON type).

[Measurement of Physical Characteristics]

1) Content of a Vinyl Aromatic Unit

Measurement instrument: Ultraviolet spectrophotometer (UV-2450, Shimadzu Corporation)

Sample: 50 mg of an unhydrogenated copolymer dissolved in 100 mL of chloroform

Measurement wavelength: 254 nm

Calibration curve: The absolute calibration curve was prepared by varying the styrene concentration of a styrene/chloroform solution.

2) Content of a Polymer Block Comprising a Vinyl Aromatic

An unhydrogenated copolymer was used to measure the content by the osmium tetraoxide degradation method described in I.M. Kolthohoff, et al., J. Polym. Sci. 1,429 (1946). To degrade the unhydrogenated copolymer, 0.1 g of osmic acid in 125 mL of a tertiary butanol solution was used.

3) Vinyl Bond Content Based on the Conjugated Diene

Measurement instrument: Infrared spectrophotometer (FT/IR-230, Hitachi, Ltd.)

Sample: 50 mg of a hydrogenated copolymer or a modified hydrogenated copolymer dissolved in 10 cc of carbon bisulfide Measurement method: The above solution was put in a 1 mm-thick KBr liquid cell to measure transmittances at 960 $cm^{-1}$ (trans), 910 $cm^{-1}$ (vinyl), 724 $cm^{-1}$ (cis), and 699 $cm^{-1}$ (styrene) and calculate the content from the measurements by the Hampton technique 4) Degree of Hydrogenation Measurement instrument: Nuclear magnetic resonance apparatus (JNM-LA400, JEOL Ltd.)

Sample: Deuterated chloroform solution of a 5 wt % hydrogenated copolymer or modified copolymer Observation frequency: 400 MHz Chemical shift reference: TMS Pulse delay: 2.9 s Number of scans: 128

Pulse width: 45°

Measurement temperature: 23° C.

$^1$H-NMR measurement was performed under the above conditions to calculate the degree of hydrogenation from styrene units (0 to 8 ppm), 1,4-butadiene (4.5 to 4.8 ppm), 1,2-butadiene units (4.9 to 5.7 ppm).

5) Weight-Average Molecular Weight and Molecular Weight Distribution

Measurement instrument: GPC (LC-10, Shimadzu Corporation) Column: Set of 4 columns connected in series consisting of one Shim-pac 803, two 804, and one 805, Shimadzu Corporation Detector: RI (differential refractometry) detector Sample: 10 mg of a hydrogenated copolymer or a modified hydrogenated copolymer dissolved in 20 cc of tetrahydrofuran Developing solvent: tetrahydrofuran; flow rate, 1 mL/min Measurement temperature: 40° C.

Calibration curve reference sample: TSK Standard Polystyrene (Mw/Mn<1.2, $10^2$<Mw≤$10^8$, 8 types), Tosoh Corporation; a tetrahydrofuran solution having the same concentration of that of the sample was prepared.

Note that the molecular weight when there are multiple peaks on a chromatogram refers to the average molecular weight calculated from the molecular weight corresponding to each peak and the composition ratio of the peaks (as determined from the area ratio at each peak on the chromatogram). In addition, the molecular weight distribution is a ratio of the weight-average molecular weight obtained to the number-average molecular weight obtained.

6) Crystallization Peak and the Amount of Heat Required for Crystallization at the Peak Measurement instrument: Differential scanning calorimeter (DSC) (DSC3200S, Mac Science Co., Ltd.)

Temperature rise conditions:

Step 1: Temperature was raised from room temperature to 150° C. at a rate of temperature rise of 30° C./min Step 2: Temperature was lowered to −100° C. at a rate of temperature drop of 10° C./min A crystallization curve was prepared to check for any crystallization peak. When a crystallization peak was found, the temperature at which the peak appeared was defined as the crystallization peak temperature. The amount of heat required for crystallization at the peak was calculated from its peak area.

7) Degree of Modification

A modified copolymer was adsorbed on a GPC column that uses a silica gel as a filler, but not on a GPC column that uses a polystyrene gel as a filler. These characteristics were used to calculate the degree of modification.

Measurement instrument: GPC (LC-10, Shimadzu Corporation)

Column:

1) Polystyrene gel column: Set of 4 columns connected in series consisting of 1×Shim-pac 803, 2×804, and 1×805, Shimadzu Corporation 2) Silica gel column: Set of 3 columns connected in series consisting of 1×Zorbax PSM60S and 2×PSM300S, DuPont Detector: RI (differential refractometry) detector Sample: 10 mg of a hydrogenated copolymer or a modified hydrogenated copolymer dissolved in 20 cc of tetrahydrofuran Developing solvent: Tetrahydrofuran; flow rate, 1 mL/min Measurement temperature: 40° C.

Calibration curve reference sample: TSK Standard Polystyrene (Mw/Mn<1.2, $10^2$<Mw≤$10^8$, 8 types), Tosoh Corporation; a tetrahydrofuran solution having the same concentration of that of the sample.

The above polystyrene gel column and silica gel column were used to produce the chromatogram for each of the two samples. The amount of adsorption on the silical gel column was calculated from the difference between these peak areas to find the degree of modification.

8) Loss Tangent (tan δ)

Measurement instrument: Dynamic viscoelastic analyzer (DVE-V4, Rheology K.K.)

Rate of temperature rise: 1° C./min

Measurement mode: Shear mode

Measurement frequency: 10 MHz

Evaluation sample: 1 mm-thick press-molded sheet

The viscoelastic spectrum was measured under the above conditions to calculate the peak temperature of tan δ.

[Method of Evaluating Physical Characteristics]
1) Sample for Thermal Conductivity Evaluation: 0.3 mm-Thick T-Die Molded Sheet
Evaluation device: Quick Thermal Conductivity Meter (QTM-500, Kyoto Electronics Manufacturing Co., Ltd.)
Measurement technique: Hot-wire method
Software used: Software for measuring thermal conductivity of thin sheet (SOFT-QTM5W, Kyoto Electronics Manufacturing Co., Ltd.)
Measurement method: The method described in Japanese Patent Publication No. 5-12361 in which measurement was performed with a reference plate whose thermal conductivity was known (foamed polyethylene, silicon rubber, quartz glass, mullite, or zirconia) to determine the thermal conductivity with a box-type probe (model No. PD-11) was used.

2) Electrical Insulation
Evaluation sample: 0.3 mm-thick T-die molded sheet
Evaluation instrument: Super-megohmmeter (model No. SM-8220, Toa Dempa Kogyo K.K.)
Measurement electrode: Electrode for plate samples (model No. SME-8311, Toa Dempa Kogyo K.K.)
Measurement method: After a voltage of 100 V was applied to a thermally conductive sheet measuring 10 cm per side formed from a thermally conductive material for 50 seconds, the volume resistance (Rv) after 10 seconds was measured to calculate the volume resistivity from the following formula.

Volume resistivity (Ω·cm)=30/(sheet thickness [mm])·$Rv$

The volume resistivities for 5 different locations were arithmetically averaged to calculate the volume resistivity (Ω·cm)

3) Hardness
Evaluation sample: 1 mm-thick press-molded sheet Evaluation instrument: Durometer Type A, Shimadzu Corporation; JIS A durometer
Measurement method: Measurement after 10 seconds according to JIS K6253

4) Toughness
<Toughness 1>
Evaluation sample: a 1 mm-thick press-molded sheet folded in half (after holding in half, 120 mm long×about 110 mm wide)
2 kg of a weight was put on the evaluation sample (pressure, about 15 g/cm$^2$) which was then left to stand at room temperature for 24 hours to evaluate whether or not there is fold cracking.
Evaluation Criteria:
Absence of fold cracking: ○
Presence of fold cracking: Δ
Inability to fold in half (poor flexibility): ×
<Toughness 2>
Evaluation sample: 0.3 mm-thick T-die molded sheet Test speed: 200 mm/min
The tear strength was measured by following the JIS K7128-3 angle tear test procedure.
Evaluation Criteria:
Tear strength of 30 N/mm or more: ○
Tear strength of 10 N/mm or more and less than 30 N/mm: Δ
Tear strength of less than 10 N/mm: ×

5) Flame Retardancy
Evaluation sample: A sheet 127 mm long×12.7 mm wide×1 mm thick prepared from a 1 mm-thick press-molded sheet
According to the UL-94 (standards established by U.S. Underwriters' Laboratories Inc.) vertical burning test, a flame was placed under the sample for 10 seconds and then removed, and the time taken for the sample to stop burning was measured. After the sample stopped burning, the flame was placed again under the sample for a further 10 seconds and then removed, and the time taken for the sample to stop burning was measured. A pair of 5 samples was evaluated (the burning time was measured a total of 10 times). The maximum burning time of 10 burning times, the total of 10 burning times, and whether or not there are drips during burning were evaluated.

The ratings for flame retardancy classification are given below. The other details are according to the UL-94 standards.
V-0: Maximum burning time, 10 seconds or less; total burning time, 50 seconds or less; no drips
V-1: Maximum burning time, 30 seconds or less; total burning time, 250 seconds or less; no drips
V-2: Maximum burning time, 30 seconds or less; total burning time, 250 seconds or less; drips permitted
Burning: The above conditions not satisfied 6) Chip Occurrence
The take-off speed of a pelletizer was adjusted so that the diameter of a strand extruded from an extruder was 2 to 3 mm (both inclusive) during producing a thermally conductive material pellet. The chip occurrence of the pellet obtained was calculated from the following formula.

Chip occurrence (mass %)=[($W1-W2$)/$W1$]×100

W1: About 100 g of the pelletized pellet precisely weighed
W2: The amount of pellet precisely weighed remaining on a 60-mesh metal screen with which chips were separated from the pellet after W1 was precisely weighed
Evaluation Criteria:
Amount of chips occurring, less than 0.1 mass %: ♦
Amount of chips occurring, 0.1 mass % or more and less than 0.3 mass %: ○
Amount of chips occurring, 0.3 mass % or more and less than 0.6 mass %: Δ
Amount of chips occurring, 0.6 mass % or more: ×

Examples 1 to 18 and Comparative Examples 1 to 9

Components added at their compositions shown in Tables 1 and 2 were melted and kneaded with a twin-screw extruder set at a cylinder temperature of 200° C. and a screw rotational speed of 200 rpm (ZSK-25; 25 mm φ; L/D=52; entire length of the heating part, 1300 mm; Werner & Pfleiderer Industrielle Backtechnik GmbH) to obtain a thermally conductive material pellet.

However, in Comparative Example 3, the paraffin oil (4) bled out, and this prevented the planned composition from being obtained, whereas in Comparative Examples 4 and 8, no uniform composition was obtained.

Examples 19 and 20

In Example 19, 1 mm-thick resin sheet was obtained with the composition of Example 2 by calendering.
In Example 20, a thermally conductive sheet specimen formed from a 1 mm-thick thermally conductive material was obtained with the composition of Example 2 by T-die sheet forming.
Table 3 shows results of evaluation comparing the formed products with the 1 mm-thick press-formed sheet of Example 2.

Examples 21 and 22

In Example 21, a 2 mm-thick resin sheet was obtained and in Example 22, a 5 mm-thick resin sheet was obtained with the composition of Example 9 by press molding. Table 4 shows results of evaluation comparing these molded products with the 1 mm-thick press-molded sheet of Example 9.

INDUSTRIAL APPLICABILITY

The thermally conductive material according to the present invention and the thermally conductive sheet molded therefrom are preferably used in applications that require high thermal conductivity, electrical insulation, flexibility, toughness, and flame retardancy, such as Thermally conductive parts for computers: Personal computers, video game machines and the like, and cell phones and the like;

Thermally conductive parts for display power supply units and the like: Home televisions, plasma displays, liquid crystal televisions, and the like;

Thermally conductive parts for AV equipment, OA equipment, and the like: DVD players, DVD recorders, HDD recorders, home televisions, plasma displays, liquid crystal televisions, and the like;

Thermally conductive parts for light sources for LED backlight: Liquid crystal TVs and the like;

Thermally conductive parts for automobile electric/electronic members: Car stereos, car navigation systems, and the like;

Other thermally conductive parts: Inverters, lights, air conditioners, and the like.

TABLE 1

| | | | Ex. 1 | Ex. 2 | Ex. 3 | Ex. 4 | Ex. 5 | Ex. 6 |
|---|---|---|---|---|---|---|---|---|
| Content (mass %) | Hydrogenated copolymer (1) | Polymer 1 | 15 | 7.5 | | | 5 | 8.5 |
| | | Polymer 2 | | | 7.5 | | | |
| | Modified hydrogenated copolymer (2) | Polymer 3 | | | | 7.5 | 5 | |
| | Other thermoplastic resin | Polymer 4 | | | | | | |
| | | Polymer 5 | | | | | | |
| | Zinc oxide (3) | Zinc oxide A | 60 | 80 | 80 | 80 | 70 | 69 |
| | | Zinc oxide B | | | | | | |
| | Paraffin oil (4) | Paraffin oil | 15 | 7.5 | 7.5 | 7.5 | 10 | 8.5 |
| | Flame retardant (5) | Flame retardant A | | | | | | 8 |
| | | Flame retardant B | | | | | | 4 |
| | | Flame retardant C | 10 | 5 | 5 | 5 | 10 | |
| | | Flame retardant D | | | | | | |
| | | Flame retardant E | | | | | | 2 |
| | Filler (6) | Filler A | | | | | | |
| | | Filler B | | | | | | |
| | | Filler C | | | | | | |
| | | Filler D | | | | | | |
| | | Filler E | | | | | | |
| | Additive | Additive A | 0.2 | 0.2 | 0.2 | 0.2 | 0.1 | 0.1 |
| | | Additive B | 0.2 | 0.2 | 0.2 | 0.2 | 0.1 | 0.1 |
| Physical characteristics evaluation | Thermal conductivity (W/m · K) | | 1.0 | 1.8 | 1.8 | 1.7 | 1.5 | 1.5 |
| | Volume resistivity (Ω · cm) | | $2 \times 10^{11}$ | $2 \times 10^{10}$ | $3 \times 10^{10}$ | $2 \times 10^{10}$ | $2 \times 10^{11}$ | $1 \times 10^{11}$ |
| | Hardness (JIS A) | | 73 | 78 | 71 | 81 | 73 | 75 |
| | Chip occurrence | | ♦ | ♦ | ♦ | ♦ | ♦ | ♦ |
| | Toughness 1 | | ○ | ○ | ○ | ○ | ○ | ○ |
| | Toughness 2 | | ○ | ○ | ○ | ○ | ○ | ○ |
| | Flame retardancy | | V-2 | V-2 | V-2 | V-2 | V-2 | V-0 |

| | | | Ex. 7 | Ex. 8 | Ex. 9 | Ex. 10 | Ex. 11 | Ex. 12 |
|---|---|---|---|---|---|---|---|---|
| Content (mass %) | Hydrogenated copolymer (1) | Polymer 1 | 8.5 | 10 | 17.5 | 10 | 20 | 6.9 |
| | | Polymer 2 | | | | | | |
| | Modified hydrogenated copolymer (2) | Polymer 3 | | | | | | |
| | Other thermoplastic resin | Polymer 4 | | | | | | |
| | | Polymer 5 | | | | | | |
| | Zinc oxide (3) | Zinc oxide A | 69.9 | 60 | 60 | 65 | 62.5 | 75.4 |
| | | Zinc oxide B | | | | | | |
| | Paraffin oil (4) | Paraffin oil | 8.5 | 10 | 17.5 | 15 | 7.5 | 6.9 |
| | Flame retardant (5) | Flame retardant A | 1.8 | | | | | |
| | | Flame retardant B | 0.9 | | | | | |
| | | Flame retardant C | 5 | | 5 | 10 | 10 | 6 |
| | | Flame retardant D | 5 | 20 | | | | |
| | | Flame retardant E | 0.4 | | | | | |
| | Filler (6) | Filler A | | | | | | 4.8 |
| | | Filler B | | | | | | |
| | | Filler C | | | | | | |
| | | Filler D | | | | | | |
| | | Filler E | | | | | | |
| | Additive | Additive A | 0.1 | 0.1 | 0.2 | 0.1 | 0.1 | 0.9 |
| | | Additive B | 0.1 | 0.1 | 0.2 | 0.1 | 0.1 | 0.2 |

TABLE 1-continued

| Physical characteristics evaluation | Thermal conductivity (W/m · K) | 1.6 | 1.2 | 1.0 | 1.5 | 1.2 | 2.1 |
|---|---|---|---|---|---|---|---|
| | Volume resistivity (Ω · cm) | $9 \times 10^{10}$ | $5 \times 10^{11}$ | $2 \times 10^{12}$ | $7 \times 10^{11}$ | $2 \times 10^{11}$ | $2 \times 10^{12}$ |
| | Hardness (JIS A) | 77 | 71 | 42 | 62 | 49 | 86 |
| | Chip occurrence | ◆ | ◆ | ◆ | ◆ | ◆ | ○ |
| | Toughness 1 | ○ | ○ | ○ | ○ | ○ | ○ |
| | Toughness 2 | ○ | ○ | ○ | ○ | ○ | ○ |
| | Flame retardancy | V-0 | V-2 | V-2 | V-2 | V-2 | V-2 |

| | | | Ex. 13 | Ex. 14 | Ex. 15 | Ex. 16 | Ex. 17 | Ex. 18 |
|---|---|---|---|---|---|---|---|---|
| Content (mass %) | Hydrogenated copolymer (1) | Polymer 1 | 7.2 | 6.9 | 10 | 8.5 | 20 | 20 |
| | | Polymer 2 | | | | | | |
| | Modified hydrogenated copolymer (2) | Polymer 3 | | | | | | |
| | Other thermoplastic resin | Polymer 4 | | | | | | |
| | | Polymer 5 | | | | | | |
| | Zinc oxide (3) | Zinc oxide A | 76 | 72.5 | 63 | 63.9 | 80 | 60 |
| | | Zinc oxide B | | | | | | |
| | Paraffin oil (4) | Paraffin oil | 7.2 | 6.9 | 10 | 8.5 | | 20 |
| | Flame retardant (5) | Flame retardant A | | | | 1.8 | | |
| | | Flame retardant B | | | | 0.9 | | |
| | | Flame retardant C | 4.8 | 4.7 | 7 | 3 | | |
| | | Flame retardant D | | | | 3 | | |
| | | Flame retardant E | | | | 0.4 | | |
| | Filler (6) | Filler A | | | | | | |
| | | Filler B | | 4.8 | | | | |
| | | Filler C | | | 9 | | | |
| | | Filler D | | | | 10 | | |
| | | Filler E | | | | 10 | | |
| | Additive | Additive A | 0.2 | 0.9 | 0.1 | 0.1 | 0.1 | 0.1 |
| | | Additive B | 0.2 | 0.2 | 0.1 | 0.1 | 0.1 | 0.1 |
| Physical characteristics evaluation | Thermal conductivity (W/m · K) | | 1.9 | 1.9 | 2.5 | 2.4 | 1.8 | 1 |
| | Volume resistivity (Ω · cm) | | $6 \times 10^{12}$ | $9 \times 10^{13}$ | $2 \times 10^{8}$ | $8 \times 10^{8}$ | $1 \times 10^{10}$ | $4 \times 10^{12}$ |
| | Hardness (JIS A) | | 83 | 81 | 75 | 83 | 91 | 35 |
| | Chip occurrence | | ○ | ○ | ○ | ○ | ◆ | ◆ |
| | Toughness 1 | | ○ | ○ | ○ | ○ | ○ | ○ |
| | Toughness 2 | | ○ | ○ | ○ | Δ | ○ | ○ |
| | Flame retardancy | | V-2 | V-2 | V-2 | V-0 | Burning | Burning |

TABLE 2

| | | | Com. Ex. 1 | Com. Ex. 2 | Com. Ex. 3 | Com. Ex. 4 | Com. Ex. 5 | Com. Ex. 6 | Com. Ex. 7 | Com. Ex. 8 | Com. Ex. 9 |
|---|---|---|---|---|---|---|---|---|---|---|---|
| Content (mass %) | Hydrogenated copolymer (1) | Polymer 1 | | 7.5 | 9 | 2.5 | 15 | 15 | | 5 | 95 |
| | | Polymer 2 | | | | | | | | | |
| | Modified hydrogenated copolymer (2) | Polymer 3 | | | | | | | | | |
| | Other thermoplastic resin | Polymer 4 | 15 | | | | | | | | |
| | | Polymer 5 | | | | | | | 30 | | |
| | Zinc oxide (3) | Zinc oxide A | 60 | | 41 | 91.5 | 5 | 67.5 | 40 | 95 | 5 |
| | | Zinc oxide B | | 80 | | | | | | | |
| | Paraffin oil (4) | Paraffin oil | 15 | 7.5 | 30 | 2.5 | 15 | 15 | 10 | | |
| | Flame retardant (5) | Flame retardant A | | | | | | | | | |
| | | Flame retardant B | | | | | | | | | |
| | | Flame retardant C | 10 | 5 | 20 | 3.5 | | | 20 | | |
| | | Flame retardant D | | | | | 65 | 2.5 | | | |
| | | Flame retardant E | | | | | | | | | |
| | Filler (6) | Filler A | | | | | | | | | |
| | | Filler B | | | | | | | | | |
| | | Filler C | | | | | | | | | |
| | | Filler D | | | | | | | | | |
| | | Filler E | | | | | | | | | |
| | Additive | Additive A | 0.2 | 0.2 | 0.2 | 0.2 | 0.1 | 0.1 | 0.1 | 0.1 | 0.1 |
| | | Additive B | 0.2 | 0.2 | 0.2 | 0.2 | 0.1 | 0.1 | 0.1 | 0.1 | 0.1 |

TABLE 2-continued

|  |  | Com. Ex. 1 | Com. Ex. 2 | Com. Ex. 3 | Com. Ex. 4 | Com. Ex. 5 | Com. Ex. 6 | Com. Ex. 7 | Com. Ex. 8 | Com. Ex. 9 |
|---|---|---|---|---|---|---|---|---|---|---|
| Physical characteristics evaluation | Thermal conductivity (W/m · K) | 0.8 | 0.6 | — | — | 0.3 | 1.8 | 0.35 | — | 0.2 |
|  | Volume resistivity (Ω · cm) | $1 \times 10^{12}$ | $8 \times 10^{11}$ | — | — | $8 \times 10^{15}$ | $5 \times 10^{10}$ | $6 \times 10^{14}$ | — | $2 \times 10^{16}$ |
|  | Hardness (JIS A) | 85 | 78 | — | — | 98< | 66 | 98< | — | 66 |
|  | Chip occurrence | ♦ | X | — | — | X | ♦ | ♦ | — | ♦ |
|  | Toughness 1 | Δ | ○ | — | — | Δ | ○ | Δ | — | ○ |
|  | Toughness 2 | X | ○ | — | — | X | ○ | ○ | — | ○ |
|  | Flame retardancy | V-2 | V-2 | — | — | V-0 | Burning | V-2 | — | Burning |

TABLE 3

|  |  | Ex. 2 | Ex. 19 | Ex. 20 |
|---|---|---|---|---|
|  | Method of producing resin sheet | Press molding | Calendering | T-die sheet forming |
| Physical characteristics evaluation | Thermal conductivity (W/m · K) | 1.8 | 2.0 | 1.6 |
|  | Volume resistivity (Ω · cm) | $2 \times 10^{10}$ | — | — |
|  | Hardness (JIS A) | 78 | 69 | 77 |
|  | Chip occurrence | ♦ | ♦ | ♦ |
|  | Toughness 1 | ○ | ○ | ○ |
|  | Toughness 2 | ○ | ○ | ○ |
|  | Flame retardancy | V-2 | V-2 | V-2 |

TABLE 4

|  |  | Ex. 9 | Ex. 21 | Ex. 22 |
|---|---|---|---|---|
|  | Method of producing resin sheet | Press molding | Press molding | Press molding |
|  | Sheet thickness (mm) | 1 | 2 | 5 |
| Physical characteristics evaluation | Thermal conductivity (W/m · K) | 1.0 | 1.0 | 1.1 |
|  | Volume resistivity (Ω · cm) | $2 \times 10^{12}$ | $8 \times 10^{12}$ | $9 \times 10^{13}$ |
|  | Hardness (JIS A) | 42 | 42 | 42 |
|  | Chip occurrence | ♦ | ♦ | ♦ |
|  | Toughness 1 | ○ | ○ | ○ |
|  | Toughness 2 | ○ | ○ | ○ |
|  | Flame retardancy | V-2 | V-2 | V-1 |

The invention claimed is:

1. A thermally conductive material comprising:
a hydrogenated copolymer (1) satisfying the following conditions (a) to (d) which is produced by hydrogenating a copolymer of a conjugated diene and a vinyl aromatic; and/or a modified hydrogenated copolymer (2) having at least one functional group and satisfying the following conditions (a) to (d), which is produced by hydrogenating a copolymer of a conjugated diene and a vinyl aromatic;
a zinc oxide (3) comprising a core part and acicular crystal parts extending from the core in four different axial directions; and
a paraffin oil (4),
wherein the thermally conductive material does not comprise a flame retardant (5), and satisfies the following conditions (A) to (C):
(a) the content of a vinyl aromatic unit is greater than 45 mass % and 90 mass % or less,
(b) the content of a vinyl aromatic polymer block is 40 mass % or less,
(c) the weight-average molecular weight is $5 \times 10^4$ to $100 \times 10^4$, and
(d) the degree of hydrogenation of double bonds based on the conjugated diene is 10% or more, and
based on 100 mass % of the thermally conductive material,
(A) the total content of the hydrogenated copolymer (1), the modified hydrogenated copolymer (2), and the paraffin oil (4), [(1)+(2)+(4)], is 10 mass % or more and 24 mass % or less,
(B) the content of the zinc oxide (3) is 76 mass % or more and 90 mass % or less, and
(C) the ratio of a mass of the paraffin oil (4) to the total mass of the hydrogenated copolymer (1) and the modified hydrogenated copolymer (2), [(4)/{(1)+(2)}], is greater than 0 and 2 or less.

2. The thermally conductive material according to claim 1, wherein the modified hydrogenated copolymer (2) has at least one functional group selected from a hydroxy group, an epoxy group, an amino group, a silanol group, and an alkoxysilane group.

3. The thermally conductive material according to claim 1, wherein the content of the vinyl aromatic polymer block in the hydrogenated copolymer (1) and/or the modified hydrogenated copolymer (2) is 10 to 40 mass %.

4. The thermally conductive material according to claim 1, wherein the content of the vinyl aromatic polymer block in the hydrogenated copolymer (1) and/or the modified hydrogenated copolymer (2) is less than 10 mass %.

5. The thermally conductive material according to claim 1, wherein the hydrogenated copolymer (1) and/or the modified hydrogenated copolymer (2) has at least one structure selected from the following general formulas:

$$B; \qquad \text{(i)}$$

$$B\text{-}A; \qquad \text{(ii)}$$

$$B\text{-}A\text{-}B; \qquad \text{(iii)}$$

(B-A)$_m$-Z; and  (iv)

(B-A)$_n$-Z-A$_p$,  (v)

(wherein B represents a random copolymer block of the conjugated diene and the vinyl aromatic, and A represents the vinyl aromatic polymer block, m is an integer of 2 or more, and each of n and p is an integer of 1 or more, Z represents a coupling agent residue).

6. The thermally conductive material according to claim 1, wherein the modified hydrogenated copolymer (2) has at least one functional group selected from the following formulas (a) to (n):

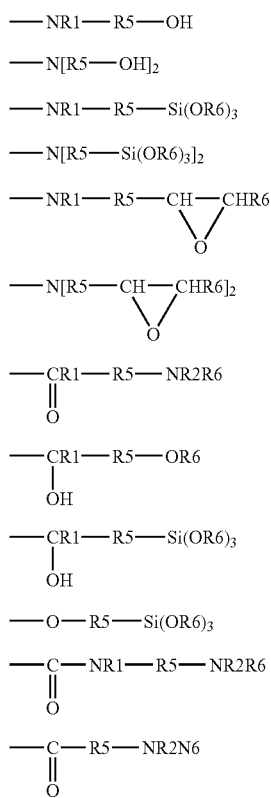

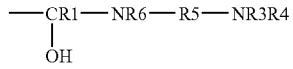

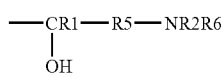

(wherein R1 to R4 independently represent hydrogen or a hydrocarbon group having a carbon number of 1 to 24, or a hydrocarbon group having a carbon number of 1 to 24 which has a functional group selected from a hydroxy group, an epoxy group, an amino group, a silanol group, and an alkoxysilane group, R5 represents a hydrocarbon chain having a carbon number of 1 to 48 or a hydrocarbon chain having a carbon number of 1 to 48 which has a functional group selected from a hydroxy group, an epoxy group, an amino group, a silanol group, and an alkoxysilane group, Elements such as oxygen, nitrogen, and silicon may bind to the hydrocarbon groups of R1 to R4 and the hydrocarbon chain of R5 in which a binding way that such elements do not take a form of a hydroxy group, an epoxy group, a silanol group, or an alkoxysilane group, R6 represents hydrogen or an alkyl group having a carbon number of 1 to 8).

7. The thermally conductive material according to claim 1, wherein the modified hydrogenated copolymer (2) is obtained by allowing addition reaction to take place between a modifier containing a functional group and a living end of an unhydrogenated copolymer obtained with an organolithium compound as a polymerization catalyst and then hydrogenating the modified unhydrogenated copolymer (2) obtained.

8. The thermally conductive material according to claim 1, wherein the content of the zinc oxide (3) is 65 mass % or more and 90 mass % or less based on 100 mass % of the thermally conductive material.

9. A thermally conductive sheet having a thickness of 30 μm to 1 mm, which is obtained by molding from the thermally conductive material claim 1.

10. A thermally conductive sheet having a thickness of greater than 1 mm to 3 cm or less, which is obtained by molding from the thermally conductive material of claim 1.

* * * * *